(12) United States Patent
Takahashi

(10) Patent No.: US 9,343,173 B2
(45) Date of Patent: May 17, 2016

(54) SEMICONDUCTOR DEVICE AND CONTROL METHOD OF THE SAME

(71) Applicant: Micron Technology, Inc., Boise, ID (US)

(72) Inventor: Susumu Takahashi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/469,352

(22) Filed: Aug. 26, 2014

(65) Prior Publication Data

US 2015/0063000 A1   Mar. 5, 2015

(30) Foreign Application Priority Data

Aug. 28, 2013   (JP) .................................. 2013-176507

(51) Int. Cl.
| | | |
|---|---|---|
| G11C 17/00 | (2006.01) | |
| G11C 17/16 | (2006.01) | |
| G11C 29/00 | (2006.01) | |
| G11C 29/44 | (2006.01) | |

(52) U.S. Cl.
CPC .............. *G11C 17/16* (2013.01); *G11C 29/785* (2013.01); *G11C 2029/4402* (2013.01)

(58) Field of Classification Search
CPC ........... G11C 11/56; G11C 2211/5641; G11C 7/1006; G11C 8/10; G11C 16/0483; G11C 16/04; G11C 17/16; G11C 29/52; G11C 29/76; G11C 29/838; G11C 2029/4402; G11C 8/04; G11C 8/12
USPC ................. 365/185.03, 222, 230.01, 96, 200, 365/210.12

See application file for complete search history.

(56) References Cited

U.S. PATENT DOCUMENTS

2011/0292710 A1 *  12/2011  Matsubayashi ...... G11C 11/406
                                                      365/94

FOREIGN PATENT DOCUMENTS

| JP | 2003288795 A | 10/2003 |
|---|---|---|
| JP | 2006147030 A | 6/2006 |
| JP | 2006179114 A | 7/2006 |
| JP | 2011233631 A | 11/2011 |

* cited by examiner

*Primary Examiner* — Thong Q Le
(74) *Attorney, Agent, or Firm* — Schwegman Lundberg & Woessner, P.A.

(57) ABSTRACT

A semiconductor device comprises a bit determination circuit to count the number of bits at a first level in an input address signal formed of a plurality of bits and to output a result indicating whether or not a value of the count exceeds a predetermined determination threshold value, as a bit determination result signal, and a selection control circuit to select a non-volatile program element to be cut off, based on the bit determination result signal and the address signal. Additional apparatus and methods are described.

16 Claims, 26 Drawing Sheets

| DEFECTIVE ADDRESS TO BE RELIEVED | A13 | A12 | A11 | A10 | A9 | A8 | A7 | A6 | A5 | A4 | A3 | A2 | A1 | A0 | NUMBER OF TIMES OF HIGH LEVEL | DETERMINATION RESULT BASED ON THRESHOLD VALUE OF 8 BITS | SELECTION OF REDUNDANCY CIRCUIT ACCORDING TO POLARITY |
|---|---|---|---|---|---|---|---|---|---|---|---|---|---|---|---|---|---|
| #0000 | 0 | 0 | 0 | 0 | 0 | 0 | 0 | 0 | 0 | 0 | 0 | 0 | 0 | 0 | 0 | LESS THAN | REDUNDANCY FOR T-SIDE |
| #1111 | 0 | 1 | 0 | 0 | 0 | 1 | 0 | 0 | 0 | 1 | 0 | 0 | 0 | 1 | 4 | LESS THAN | REDUNDANCY FOR T-SIDE |
| #1F34 | 0 | 1 | 1 | 1 | 1 | 1 | 0 | 0 | 1 | 1 | 0 | 1 | 0 | 0 | 8 | NOT LESS THAN | REDUNDANCY FOR N-SIDE |
| #236A | 1 | 0 | 0 | 0 | 1 | 1 | 0 | 1 | 1 | 0 | 1 | 0 | 1 | 0 | 7 | LESS THAN | REDUNDANCY FOR T-SIDE |
| #3667 | 1 | 1 | 0 | 1 | 1 | 0 | 0 | 1 | 1 | 0 | 0 | 1 | 1 | 1 | 9 | NOT LESS THAN | REDUNDANCY FOR N-SIDE |
| #4E03 | 0 | 0 | 1 | 1 | 1 | 0 | 0 | 0 | 0 | 0 | 0 | 0 | 1 | 1 | 5 | LESS THAN | REDUNDANCY FOR T-SIDE |
| #7ADF | 1 | 1 | 1 | 0 | 1 | 0 | 1 | 1 | 0 | 1 | 1 | 1 | 1 | 1 | 11 | NOT LESS THAN | REDUNDANCY FOR N-SIDE |

| DEFECTIVE ADDRESS TO BE RELIEVED | A13 | A12 | A11 | A10 | A9 | A8 | A7 | A6 | A5 | A4 | A3 | A2 | A1 | A0 | NUMBER OF TIMES OF HIGH LEVEL | THRESHOLD VALUE DETERMINATION | ABILITY OF INTERNAL SVT POWER SUPPLY |
|---|---|---|---|---|---|---|---|---|---|---|---|---|---|---|---|---|---|
| #0000 | 0 | 0 | 0 | 0 | 0 | 0 | 0 | 0 | 0 | 0 | 0 | 0 | 0 | 0 | 0 | 0-3bit | Down |
| #1111 | 0 | 1 | 0 | 0 | 0 | 1 | 0 | 0 | 0 | 1 | 0 | 0 | 0 | 1 | 4 | 4-7bit | Typ |
| #1F34 | 0 | 1 | 1 | 1 | 1 | 1 | 0 | 0 | 1 | 1 | 0 | 1 | 0 | 0 | 8 | 8-11bit | Up |
| #236A | 1 | 0 | 0 | 0 | 1 | 1 | 0 | 1 | 1 | 0 | 1 | 0 | 1 | 0 | 7 | 4-7bit | Typ |
| #3667 | 1 | 1 | 0 | 1 | 1 | 0 | 0 | 1 | 1 | 0 | 0 | 1 | 1 | 1 | 9 | 8-11bit | Up |
| #4E03 | 0 | 0 | 1 | 1 | 1 | 0 | 0 | 0 | 0 | 0 | 0 | 0 | 1 | 1 | 5 | 4-7bit | Typ |

| ALL HAVING T-SIDE POLARITY | | | | | | | | ALL HAVING N-SIDE POLARITY | | | | | | | |
|---|---|---|---|---|---|---|---|---|---|---|---|---|---|---|---|
| AF ROW SET0 | AF ROW SET1 | AF ROW SET2 | AF ROW SET3 | AF ROW SET4 | AF ROW SET5 | AF ROW SET6 | AF ROW SET7 | AF ROW SET8 | AF ROW SET9 | AF ROW SETA | AF ROW SETB | AF ROW SETC | AF ROW SETD | AF ROW SETE | AF ROW SETF |
| HIGH ──────────► LOW | | | | | | | | HIGH ──────────► LOW | | | | | | | |
| PRIORITY BEING HIGHER IN THE CASE OF NOT MORE THAN THRESHOLD VALUE | | | | | | | | PRIORITY BEING HIGHER IN THE CASE OF NOT LESS THAN THRESHOLD VALUE | | | | | | | |
| PRIORITY ORDERS OF AF ELEMENTS TO BE USED FOR RELIEVING IN POST-PROCESS | | | | | | | | | | | | | | | |

| FUSE SETS | POLARITIES OF ANTIFUSE ELEMENTS | ANTIFUSE ELEMENTS TO BE CUT OFF |
|---|---|---|
| AF SET8 A0 | N | O |
| AF SET8 A1 | N | |
| AF SET8 A2 | N | |
| AF SET8 A3 | N | |
| AF SET8 A4 | N | O |
| AF SET8 A5 | N | |
| AF SET8 A6 | N | |
| AF SET8 A7 | N | |
| AF SET8 A8 | N | O |
| AF SET8 A9 | N | |
| AF SET8 A10 | N | |
| AF SET8 A11 | N | |
| AF SET8 A12 | N | |
| AF SET8 A13 | N | |
| AF SET8 EN | T | O |

| FUSE SET | POLARITY OF ANTIFUSE ELEMENT | PRIORITY ORDER OF EACH ANTIFUSE ELEMENT OF SAME POLARITY | PRIORITY ORDER OF ANTIFUSE ELEMENT | |
|---|---|---|---|---|
| | | | PRIORITY ORDER IN THE CASE OF LESS THAN THRESHOLD VALUE | PRIORITY ORDER IN THE CASE OF NOT LESS THAN THRESHOLD VALUE |
| AF ROW SET0 | T | 1 | 1 | 9 |
| AF ROW SET1 | T | 2 | 2 | 10 |
| AF ROW SET2 | T | 3 | 3 | 11 |
| AF ROW SET3 | T | 4 | 4 | 12 |
| AF ROW SET4 | T | 5 | 5 | 13 |
| AF ROW SET5 | T | 6 | 6 | 14 |
| AF ROW SET6 | T | 7 | 7 | 15 |
| AF ROW SET7 | T | 8 | 8 | 16 |
| AF ROW SET8 | N | 1 | 9 | 1 |
| AF ROW SET9 | N | 2 | 10 | 2 |
| AF ROW SETA | N | 3 | 11 | 3 |
| AF ROW SETB | N | 4 | 12 | 4 |
| AF ROW SETC | N | 5 | 13 | 5 |
| AF ROW SETD | N | 6 | 14 | 6 |
| AF ROW SETE | N | 7 | 15 | 7 |
| AF ROW SETF | N | 8 | 16 | 8 |

| DEFECTIVE ADDRESS TO BE RELIEVED | A13 | A12 | A11 | A10 | A9 | A8 | A7 | A6 | A5 | A4 | A3 | A2 | A1 | A0 | NUMBER OF TIMES OF HIGH LEVEL | DETERMINATION RESULT BASED ON THRESHOLD VALUE OF 8 BITS | PRIORITY ORDER OF POLARITY |
|---|---|---|---|---|---|---|---|---|---|---|---|---|---|---|---|---|---|
| #0000 | 0 | 0 | 0 | 0 | 0 | 0 | 0 | 0 | 0 | 0 | 0 | 0 | 0 | 0 | 0 | LESS THAN | T-SIDE (HIGHER) → N-SIDE (LOWER) |
| #0E03 | 0 | 0 | 1 | 1 | 1 | 0 | 0 | 0 | 0 | 0 | 0 | 0 | 1 | 1 | 5 | LESS THAN | T-SIDE (HIGHER) → N-SIDE (LOWER) |
| #1111 | 0 | 1 | 0 | 0 | 0 | 1 | 0 | 0 | 0 | 1 | 0 | 0 | 0 | 1 | 4 | LESS THAN | T-SIDE (HIGHER) → N-SIDE (LOWER) |
| #1F34 | 0 | 1 | 1 | 1 | 1 | 1 | 1 | 0 | 0 | 1 | 1 | 0 | 1 | 0 | 8 | NOT LESS THAN | N-SIDE (HIGHER) → T-SIDE (LOWER) |
| #236A | 1 | 0 | 0 | 0 | 1 | 1 | 0 | 1 | 1 | 0 | 1 | 0 | 1 | 0 | 7 | LESS THAN | T-SIDE (HIGHER) → N-SIDE (LOWER) |
| #3667 | 1 | 1 | 0 | 1 | 1 | 0 | 0 | 1 | 1 | 0 | 0 | 1 | 1 | 1 | 9 | NOT LESS THAN | N-SIDE (HIGHER) → T-SIDE (LOWER) |
| #3ADF | 1 | 1 | 1 | 0 | 1 | 0 | 1 | 1 | 0 | 1 | 1 | 1 | 1 | 1 | 11 | NOT LESS THAN | N-SIDE (HIGHER) → T-SIDE (LOWER) |

| DEFECTIVE ADDRESS TO BE RELIEVED | A13 | A12 | A11 | A10 | A9 | A8 | A7 | A6 | A5 | A4 | A3 | A2 | A1 | A0 | NUMBER OF TIMES OF HIGH LEVEL | DETERMINATION RESULT BASED ON THRESHOLD VALUE OF 8 BITS | ANTIFUSE ELEMENT POLARITY SELECTION | AF-TRUE | AF-NOT | AF-A13 | AF-A12 | AF-A11 | AF-A10 | AF-A9 | AF-A8 | AF-A7 | AF-A6 | AF-A5 | AF-A4 | AF-A3 | AF-A2 | AF-A1 | AF-A0 | TOTAL NUMBER OF ANTIFUSE ELEMENTS TO BE CUT OFF |
|---|---|---|---|---|---|---|---|---|---|---|---|---|---|---|---|---|---|---|---|---|---|---|---|---|---|---|---|---|---|---|---|---|---|---|
| #0000 | 0 | 0 | 0 | 0 | 0 | 0 | 0 | 0 | 0 | 0 | 0 | 0 | 0 | 0 | 0 | LESS THAN | TRUE-SIDE | O | – | – | – | – | – | – | – | – | – | – | – | – | – | – | – | 1 |
| #0E03 | 0 | 0 | 1 | 1 | 1 | 0 | 0 | 0 | 0 | 0 | 0 | 0 | 1 | 1 | 5 | LESS THAN | TRUE-SIDE | O | – | – | – | – | O | O | – | – | – | – | – | – | – | O | O | 7 |
| #1111 | 0 | 1 | 0 | 0 | 0 | 1 | 0 | 0 | 0 | 1 | 0 | 0 | 0 | 1 | 4 | LESS THAN | TRUE-SIDE | O | – | – | O | – | – | O | – | – | – | O | – | – | – | – | O | 5 |
| #1F34 | 0 | 1 | 1 | 1 | 1 | 1 | 0 | 0 | 1 | 1 | 0 | 1 | 0 | 0 | 8 | NOT LESS THAN | NOT-SIDE | – | O | – | O | O | O | O | O | – | – | O | O | – | O | – | – | 8 |
| #236A | 0 | 0 | 1 | 0 | 0 | 1 | 1 | 0 | 1 | 1 | 0 | 1 | 0 | 0 | 7 | LESS THAN | TRUE-SIDE | O | – | – | – | O | – | – | O | O | O | O | – | O | – | – | – | 8 |
| #3667 | 1 | 1 | 0 | 1 | 1 | 0 | 0 | 1 | 1 | 0 | 0 | 1 | 1 | 1 | 9 | NOT LESS THAN | NOT-SIDE | – | O | O | O | – | – | O | O | – | – | O | – | – | – | – | – | 7 |
| #3ADF | 1 | 1 | 1 | 0 | 1 | 0 | 1 | 1 | 0 | 1 | 1 | 1 | 1 | 1 | 11 | NOT LESS THAN | NOT-SIDE | – | O | – | – | O | O | – | O | – | – | – | – | – | – | – | – | 4 |

FIG. 18

| NUMBER OF (TIMES) OF DIVISIONS | MAXIMUM TOTAL NUMBER OF FUSES TO BE CUT OFF |
|---|---|
| 1 | 8 |
| 2 | 4 |
| 3 | 3 |
| 4 | 2 |
| 8 | 1 |

| DEFECTIVE ADDRESS TO BE RELIEVED | A0 | A1 | A2 | A3 | A4 | A5 | A6 | A7 | A8 | A9 | A10 | A11 | A12 | A13 | NUMBER OF TIMES OF HIGH LEVEL | DETERMINATION RESULT BASED ON THRESHOLD VALUE OF 8 BITS | ANTIFUSE ELEMENT POLARITY SELECTION | AF-TRUE | AF-NOT | AF-A13 | AF-A12 | AF-A11 | AF-A10 | AF-A9 | AF-A8 | AF-A7 | AF-A6 | AF-A5 | AF-A4 | AF-A3 | AF-A2 | AF-A1 | AF-A0 | TOTAL NUMBER OF ANTIFUSE ELEMENTS TO BE CUT OFF | NUMBER OF CUT-OFFS IN FIRST-TIME PROGRAMMING | NUMBER OF CUT-OFFS IN SECOND-TIME PROGRAMMING |
|---|---|---|---|---|---|---|---|---|---|---|---|---|---|---|---|---|---|---|---|---|---|---|---|---|---|---|---|---|---|---|---|---|---|---|---|---|
| #0000 | 0 | 0 | 0 | 0 | 0 | 0 | 0 | 0 | 0 | 0 | 0 | 0 | 0 | 0 | 0 | LESS THAN | TRUE-SIDE | ○ | - | - | - | - | - | - | - | - | - | - | - | - | - | - | - | 1 | 1 | 0 |
| #007F | 1 | 1 | 1 | 1 | 1 | 1 | 1 | 0 | 0 | 0 | 0 | 0 | 0 | 0 | 7 | LESS THAN | TRUE-SIDE | ○ | - | - | - | - | - | - | - | - | ○ | ○ | ○ | ○ | ○ | ○ | ○ | 8 | 4 | 4 |
| #00FF | 1 | 1 | 1 | 1 | 1 | 1 | 1 | 1 | 0 | 0 | 0 | 0 | 0 | 0 | 8 | NOT LESS THAN | NOT-SIDE | - | ○ | ○ | ○ | ○ | ○ | ○ | - | - | - | - | - | - | - | - | - | 7 | 4 | 3 |
| #0E03 | 1 | 1 | 0 | 0 | 0 | 0 | 0 | 0 | 1 | 1 | 1 | 0 | 0 | 0 | 5 | LESS THAN | TRUE-SIDE | ○ | - | - | - | ○ | ○ | ○ | - | - | - | - | - | - | ○ | ○ | - | 6 | 4 | 2 |
| #1111 | 1 | 0 | 0 | 0 | 1 | 0 | 0 | 0 | 1 | 0 | 0 | 0 | 1 | 0 | 4 | LESS THAN | TRUE-SIDE | ○ | - | - | ○ | - | - | ○ | - | - | - | ○ | - | - | - | - | ○ | 5 | 4 | 1 |
| #1F34 | 0 | 0 | 1 | 0 | 1 | 1 | 0 | 0 | 1 | 1 | 1 | 1 | 1 | 0 | 8 | NOT LESS THAN | NOT-SIDE | - | ○ | - | - | - | - | - | ○ | ○ | ○ | - | ○ | - | ○ | - | - | 7 | 4 | 3 |
| #236A | 0 | 1 | 0 | 1 | 0 | 1 | 1 | 0 | 1 | 0 | 0 | 0 | 0 | 1 | 7 | LESS THAN | TRUE-SIDE | ○ | - | ○ | - | - | - | ○ | - | ○ | - | ○ | - | ○ | - | ○ | - | 8 | 4 | 4 |
| #3667 | 1 | 1 | 1 | 0 | 0 | 1 | 1 | 0 | 1 | 1 | 0 | 1 | 1 | 0 | 9 | NOT LESS THAN | NOT-SIDE | - | ○ | - | - | ○ | - | - | ○ | - | - | ○ | ○ | - | - | - | - | 6 | 4 | 2 |
| #3ADF | 1 | 1 | 1 | 1 | 1 | 0 | 1 | 1 | 0 | 1 | 0 | 1 | 1 | 1 | 11 | NOT LESS THAN | NOT-SIDE | - | ○ | - | - | ○ | - | ○ | - | ○ | - | ○ | - | - | - | - | - | 4 | 4 | 0 |
| #3F70 | 0 | 0 | 0 | 0 | 1 | 1 | 1 | 1 | 0 | 1 | 1 | 1 | 1 | 1 | 8 | NOT LESS THAN | NOT-SIDE | - | ○ | - | - | - | ○ | - | ○ | - | ○ | - | - | ○ | ○ | ○ | ○ | 7 | 4 | 3 |

CUT-OFFS FOR 4 BITS IN FIRST-TIME PROGRAMMING AND CUT-OFFS FOR 5 BITS IN SECOND-TIME PROGRAMMING

SEMICONDUCTOR DEVICE AND CONTROL METHOD OF THE SAME

RELATED REFERENCE

The present application is based upon and claims the benefit of the priority of Japanese Patent Application No. 2013-176507 (filed on Aug. 28, 2013), the disclosure of which is incorporated herein in its entirety by reference.

TECHNICAL FIELD

The present application relates to a semiconductor device and a control method of the semiconductor device. More specifically, the application relates to a semiconductor device including a redundancy circuit configured to relieve a defective memory cell and a controlling method of the semiconductor device.

BACKGROUND

In recent years, the storage capacity of a semiconductor device is increasing year by year due to miniaturizations of a memory cell and a peripheral circuit. Along with the increase in the storage capacity, however, the risk of inclusion of a defective memory cell also increases. Then, technologies have been proposed in which, by including a normal memory cell and a redundant memory cell to be used when a defect has been detected in the normal memory cell, the normal memory cell with the defect detected therein (hereinafter referred to as a defective memory cell) is relieved (as in JP2011-233631A (Patent Literature 1), JP2006-147030A (Patent Literature 2), JP2006-179114A (Patent Literature 3) and JP2003-288795A (Patent Literature 4)). Specifically, in the technologies disclosed in Patent Literatures 1 to 4, the defective memory cell is replaced with the redundant memory cell, thereby relieving the defective memory cell.

Each disclosure of the above-listed Patent Literature is incorporated herein by reference in its entirety.

BRIEF DESCRIPTION OF THE DRAWINGS

FIG. 7 is a table showing a correspondence relationship between each defective address to be relieved and a bit determination result signal;

FIG. 10 is a table showing a correspondence relationship between each defective address to be relieved and a bit determination result signal;

FIG. 11 is a table showing a priority order of each antifuse element;

FIG. 12 is a table showing an example when a defective address signal is relieved;

FIG. 13 is a table showing a priority order of each fuse set;

FIG. 14 is a table associating each defective address with a bit determination result and a priority order of the polarity of a fuse set;

FIG. 18 is a table associating each defective address with a bit determination result, polarity selection, and the total number of antifuse elements to be cut off;

FIG. 22 is a table showing a correspondence relationship between the number of divisions for cut-off and the maximum total number of fuses to be cut off;

FIG. 23 is a table associating each defective address signal with antifuse element polarity selection and the total number of antifuse elements to be cut off;

DETAILED DESCRIPTION

Figure 1:
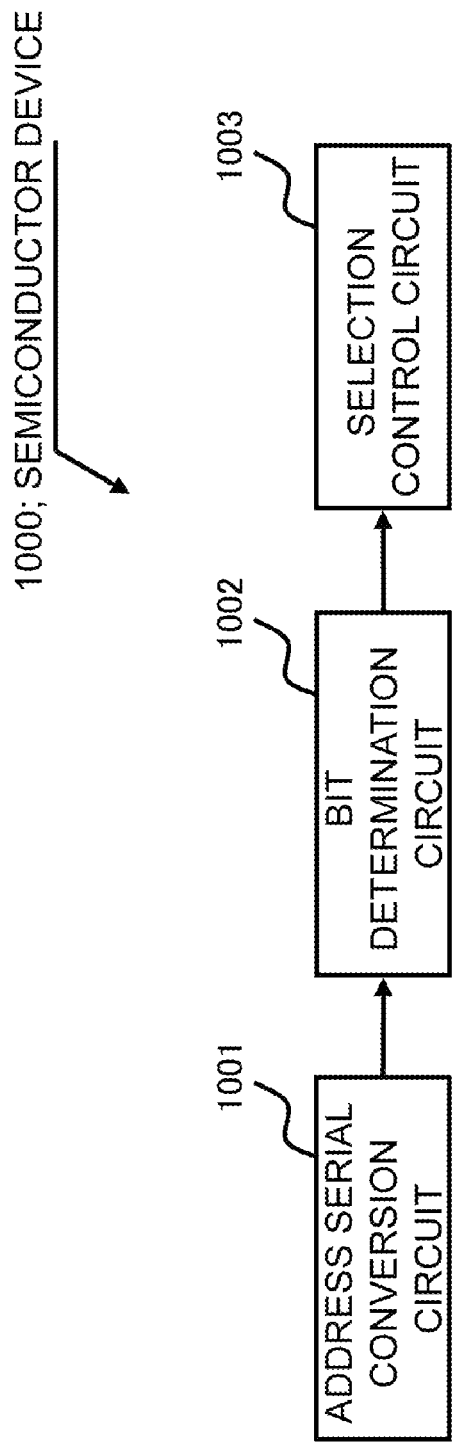
FIG. 1 is a block diagram showing an overview of one embodiment of the present application.

First, an overview of various embodiments will be described using FIG. 1. A reference sign in the drawing appended to this overview is appended to each element, for convenience, to increase understanding, and the description of this overview does not intend to impose any limitation.

As described above, a semiconductor device and a control method of the semiconductor device configured to contribute to efficiently relieving a defective memory cell are desired.

Then, a semiconductor device 1000 shown in FIG. 1 is provided, as an example. The semiconductor device 1000 may include an address serial conversion circuit 1001, a bit determination circuit 1002, and a selection control circuit 1003.

The address serial conversion circuit 1001 serially converts a defective address signal and outputs the converted signal as a serially converted address signal. The serially converted address serial herein means a signal obtained by converting the address signal(s) for each bit to a clock signal.

The serially converted address signal is supplied to the bit determination circuit 1002. Then, the bit determination circuit 1002 counts the number of times of a high level in the supplied serially converted address signal, as the number of times of the high level. The bit determination circuit 1002 then outputs a result of a determination whether or not the counted number of times of the high level exceeds a predetermined determination threshold value, as a bit determination result signal.

The selection control circuit 1003 selects a program element to be programmed, based on the bit determination result signal. Programming of the program element means the transition of the program element from a non-conduction (or a conduction) state that is a non-programmed state to the conduction (or the non-conduction) state that is a programmed state.

That is, the program element to be programmed is selected based on the number of high level bits (bits with a logic level of 1) of the defective address signal, in the semiconductor device 1000. As a result, wasteful programming of a program element can be prevented in the semiconductor device 1000. Consequently, the semiconductor device 1000 may contribute to efficiently relieving a defective memory cell.

In the following description, the antifuse element to be programmed when the bit of the defective address signal is low will be referred to as a "NOT-side polarity antifuse element (or an N-side polarity antifuse element)". Further, in the following description, the antifuse element to be programmed when the bit of the defective address signal is high will be referred to as a "TRUE-side polarity antifuse element (or a T-side polarity antifuse element)".

[First Embodiment]

A first embodiment will be described below in more detail, using the drawings. The description will be given about a case where an antifuse element is used as a program element. This does not mean, however, that the subject of the present application is limited to the antifuse element.

Figure 2:
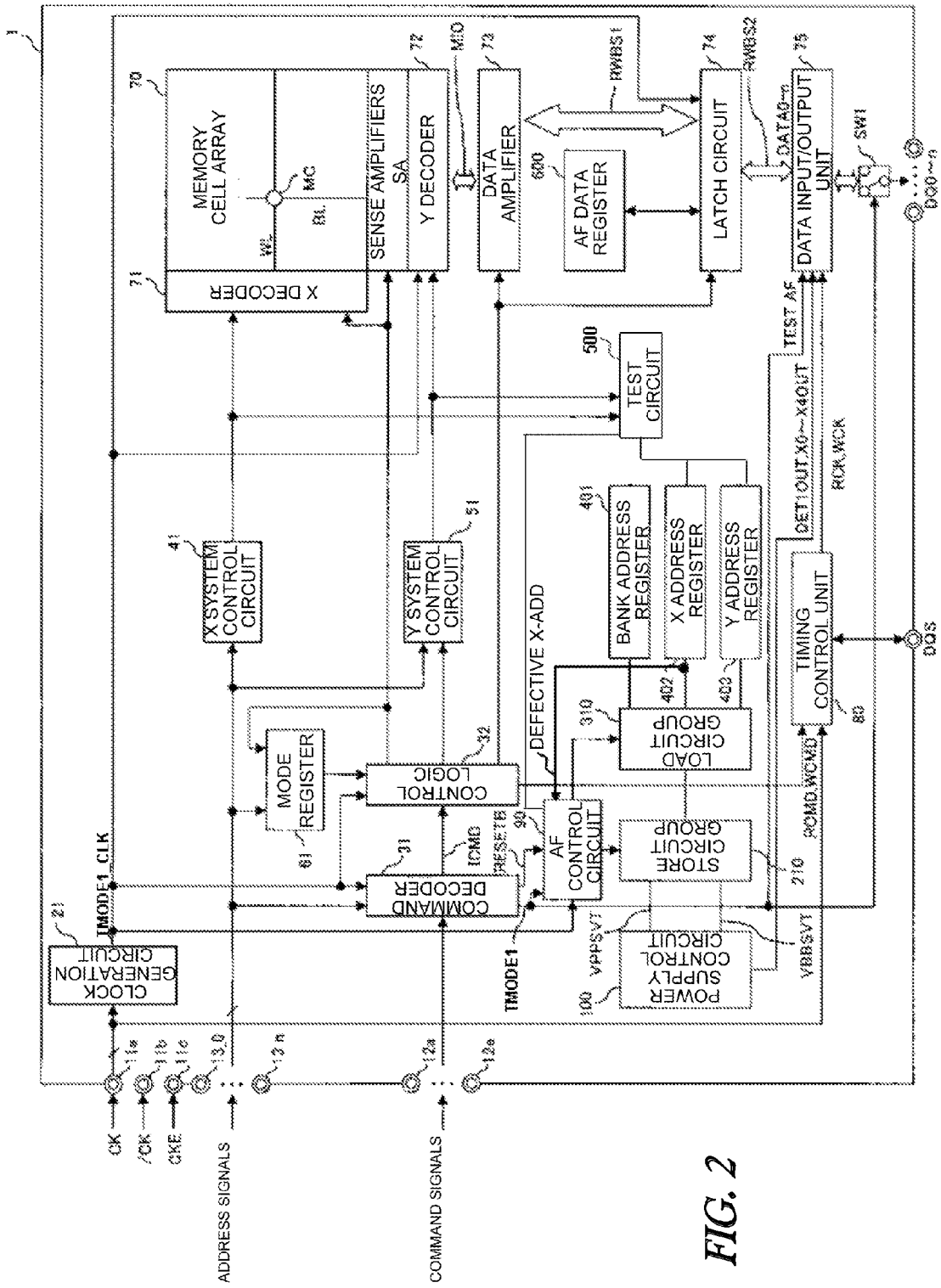
FIG. 2 is a block diagram showing an overall configuration of a semiconductor device 1 according to a first embodiment.

FIG. 2 is a block diagram showing an overall configuration of a semiconductor device 1 according to the first embodiment. Though a DRAM (Dynamic Random Access Memory) is illustrated as the semiconductor device 1, this does not mean that the present application is limited to the DRAM.

The semiconductor device 1 may includes clock pads 11a and 11b, a clock enable pad 11c, command pads 12a to 12e, address pads 13_0 to 13_n, a clock generation circuit 21, a command decoder 31, a control logic 32, an X system control circuit 41, a Y system control circuit 51, a mode register 61, a memory cell array 70, an X decoder 71, a Y decoder 72, a data amplifier 73, a latch circuit 74, a data input/output unit 75, a timing control unit 80, an AF control circuit 90, a power supply control circuit 100, a STORE circuit group 210, a LOAD circuit group 310, a bank address register 401, an X address register 402, a Y address register 403, a test circuit 500, an AF data register 600, and a switch SW1.

The clock pads 11a and 11b may include pads to which external clock signals CK and /CK are respectively supplied. The clock enable pad 11c may include a pad to which a clock enable signal CKE is supplied. The external clock signals CK and /CK and the external clock enable signal CKE supplied to the respective pads are each supplied to the clock generation circuit 21 and the timing control unit 80. A signal with the sign "/" at the beginning of the signal name means that the signal is an inverted signal of a corresponding signal or a low active signal. For example, the external clock signals CK and /CK may be mutually complementary signals.

The clock generation circuit 21 generates an internal clock signal TMODE 1_CLK, based on the external clock signals CK and /CK and the external clock enable signal CKE. Then, the clock generation circuit 21 supplies the generated internal clock signal TMODE 1_CLK to each of the command decoder 31, the control logic 32, the Y decoder 72, the latch circuit 74, and the AF control circuit 90.

The command pads 12a to 12e may include pads to be respectively supplied for an X address strobe signal /RAS, a Y address strobe signal /CAS, a write enable signal /WE, a chip select signal /CS, and an on die termination signal ODT. These command signals may be supplied to the command decoder 31.

The address pads 13_0 to 13_n may include pads to which address signals ADD are supplied. Then, the supplied address signals ADD are fed to each of the command decoder 31, the X system control circuit 41, the Y system control circuit 51, and the mode register 61 through an address input circuit (not shown).

The command decoder 31 performs holding, decoding, counting, and so forth of a part of the command signals and the address signals, in synchronization with the internal clock TMODE 1_CLK supplied from the clock generation circuit 21, and generates various internal commands ICMD. Then, the command decoder 31 supplies the generated internal commands ICMD to the control logic 32.

The command decoder 31 supplies a signal TMODE 1 to each of the data input/output unit 75, the AF control circuit 90, and the switch SW1, and supplies a signal RESETB to the AF control circuit 90.

The control logic 32 controls an operation of each unit, in synchronization with the internal clock TMODE 1_CLK supplied from the clock generation circuit 21 and according to the internal commands ICMD supplied from the command decoder 31 and an output of the mode register 61.

The X system control circuit 41 supplies an X address supplied from the address pads 13_0 to 13_n to each of the X decoder 71 and the test circuit 500.

The Y system control circuit 51 supplies a Y address supplied from the address pads 13_0 to 13_n to each of the Y decoder 72 and the test circuit 500.

The mode register 61 stores an operation mode of the semiconductor device 1.

In the memory cell array 70, a plurality of word lines WL and a plurality of bit lines BL are crossed, and memory cells MC are disposed at intersections of the word lines WL and the bit lines BL. Each bit line BL is connected to a corresponding sense amplifier SA.

The X decoder 71 selects one of the plurality of word lines WL included in the memory cell array 70.

The Y decoder 72 selects one of a plurality of sense amplifiers SA. The sense amplifier SA selected by the Y decoder 72 is connected to the data amplifier 73 through a main I/O line MIO.

The data amplifier 73 further amplifies read data RD that has been amplified by the sense amplifier SA when a read operation is performed. Then, the data amplifier 73 supplies the amplified read data RD to the latch circuit 74 through a read/write bus RWBS1. On the other hand, the data amplifier 73 amplifies write data WD supplied from the latch circuit 74 when a write operation is performed. Then, the data amplifier 73 supplies the amplified write data WD to the memory cell array 70.

The data input/output unit 75 performs input/output of input/output data DATA0 to DATAn through data terminals DQ0 to DQn.

The timing control unit 80 may include a DLL (Delay Locked Loop) circuit configured to control a data input/output timing. Then, when a read operation is performed, the timing control unit 80 supplies a read timing signal RCK according to a read command RCMD supplied from the control logic 32 and the external clock signals CK and /CK and outputs a data strobe signal DQS to an outside through a data strobe pad DQS. The read timing signal RCK is a signal configured to control a timing of reading data by the data input/output unit 75.

On the other hand, when a write operation is performed, the timing control unit 80 supplies a write timing signal WCK to the data input/output unit 75, according to a write command WCMD supplied from the control logic 32, the external clock signals CK and /CK and the data strobe signal DQS supplied from the outside through the data strobe pad DQS. The write timing signal WCK controls a timing of acquiring write data by the data input/output unit 75.

The AF control circuit 90 is provided between the command decoder 31 and each of the STORE circuit group 210 and the LOAD circuit group 310. The AF control circuit 90 receives the signal TMODE 1 supplied from the command decoder 31, the internal clock signal TMODE 1_CLK supplied from the clock generation circuit 21, and a defective address signal X-ADD that is a defective address signal from the X address register 402. Then, the AF control circuit 90 supplies a control signal to each of the STORE circuit group 210 and the LOAD circuit group 310.

The power supply control circuit 100 supplies a write voltage to the antifuse element when a write operation to the antifuse element is performed. At the time of performing the operation of verifying the state of writing into the antifuse element (hereinafter referred to as the time of performing the verifying operation), the power supply control circuit 100 supplies a plurality of monitor signals DET1OUT and X0OUT to X4OUT indicating a result of the verifying operation to the data input/output unit 75. The monitor signals DET1OUT and X0OUT to X4OUT are output to the outside of the semiconductor device 1 through the data terminals DQ0 to DQ9.

When a normal operation is performed, data DATA0 to DATA 5 are input into or output through the data terminals DQ0 to DQ9, for an AF power supply circuit. On the other hand, when the verifying operation is performed, a signal TESTS_AF is supplied to the switch SW1, and the monitor signals DET1OUT and X0OUT to X4OUT are output to the outside of the semiconductor device 1 through the data terminals DQ0 to DQ9. Data writing into the antifuse element is performed when the address of a defective memory cell associated with the antifuse element is programmed in order to relieve the defective memory cell.

The STORE circuit group 210 includes a plurality of fuse sets. Each fuse set includes an antifuse element (program element) configured to store a defective address. Then, each fuse set performs a writing operation to the antifuse element included in the fuse set itself and conducts a verifying operation for the antifuse element included un the fuse set itself. Herein, the STORE circuit group 210 operates as a redundant circuit (hereinafter referred to as a redundancy circuit). That is, the STORE circuit group 210 (redundancy circuit) includes at least one or two antifuse elements (program elements) configured to store data on the defective address by the application of a voltage.

The LOAD circuit group 310 includes a plurality of LOAD circuits. Each LOAD circuit performs an operation of reading the data stored in the antifuse element included by a corresponding one of the fuse sets in the STORE circuit group 210. The data stored in the antifuse element includes the defective address and so forth.

The bank address register 401 stores a defective memory cell bank address read by the LOAD circuit group 310.

The X address register 402 stores the X address of the defective memory cell read by the LOAD circuit group 310.

The Y address register 403 stores the Y address of the defective memory cell read by the LOAD circuit group 310.

The defective address to be relieved is supplied to the test circuit 500 by the X system control circuit 41 and the Y system control circuit 51. The test circuit 500 generates the test mode signal TMODE1 and supplies the test mode signal TMODE1 to the AF control circuit 90. Further, the test circuit 500 supplies to the X address register 402 with the X address of the supplied defective address to be relieved. Further, the test circuit 500 supplies to the Y address register 403 with the Y address of the supplied defective address to be relieved.

The AF data register 600 stores data to be written into or read from the defective memory cell, in place of the defective memory cell.

Figure 3:
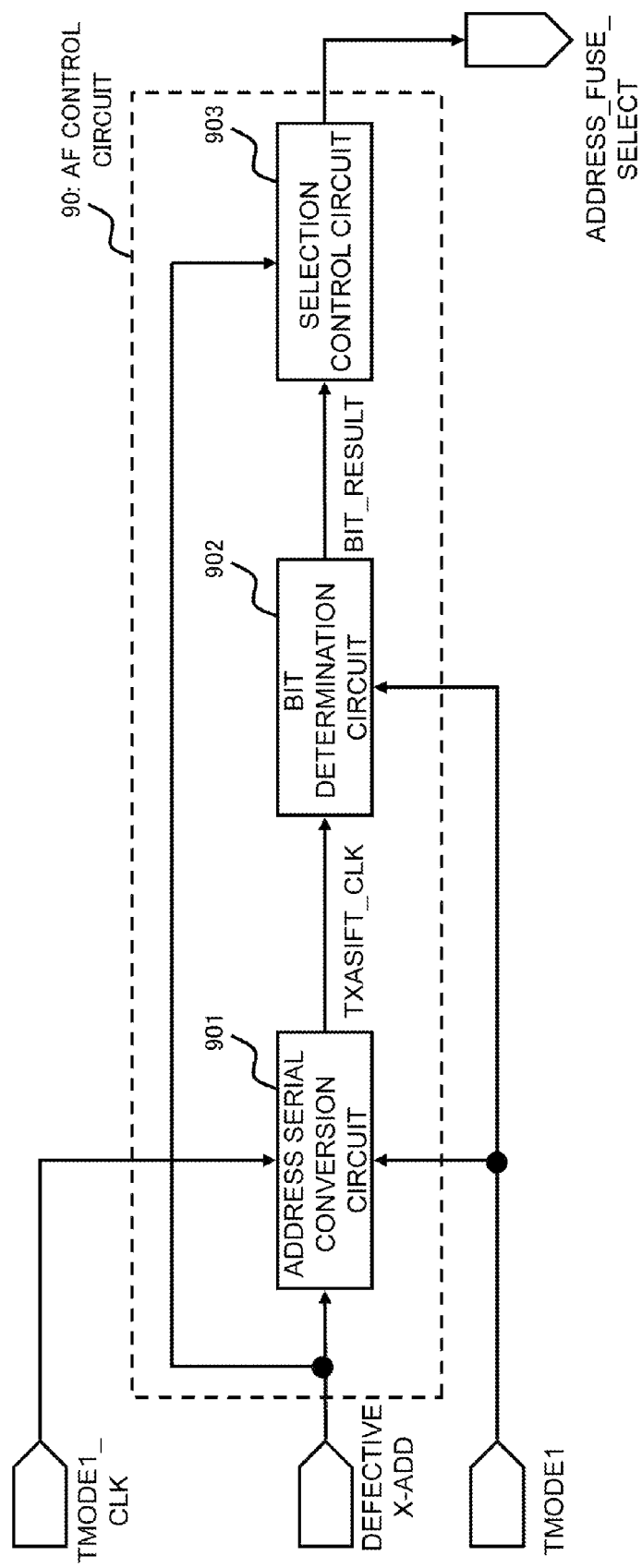
FIG. 3 is a block diagram showing an example of a configuration of an AF control circuit 90.

FIG. 3 is a block diagram showing an example of a configuration of the AF control circuit 90. The AF control circuit 90 may include an address serial conversion circuit 901, a bit determination circuit 902, and a selection control circuit 903. In the following explanation, relief of an X address will be explained. This does not, however, mean that the subject of the present application is limited to relieving the X address.

The clock signal TMODE1_CLK from the clock generation circuit 21, the signal TMODE1 from the command decoder 31, and the defective address signal X-ADD from the X address register 402, which is the defective address signal, are supplied to the address serial conversion circuit 901. Then, the address serial conversion circuit 901 converts the defective address signal X-ADD to a serially converted address signal TXASIFT_CLK, and then outputs the signal TXASIFT_CLK.

The clock signal TMODE1 and the serially converted clock signal TXASIFT_CLK are supplied to the bit determination circuit 902. Then, the bit determination circuit 902 counts the number of times of inclusion of a high level bit in the serially converted defective address signal. The bit determination circuit 902 then determines whether or not the number of counts for switching exceeds a predetermined threshold value set for the total number of fuses. Then, the bit determination circuit 902 outputs a result of the determination as a bit determination result signal BIT_RESULT.

The selection control circuit 903 switches the antifuse element(s) (a program element(s)) to be programmed according to whether or not the number of times a high level reaches the predetermined determination threshold value or higher. Specifically, the bit determination result signal BIT_RESULT is supplied to the selection control circuit 903. Then, when the bit determination result signal BIT_RESULT is high, the selection control circuit 903 outputs an antifuse selection signal ADDRESS_FUSE_SELECT so that the antifuse element(s) of a TRUE-side polarity are programmed. On the other hand, when the bit determination result signal BIT_RESULT is low, the selection control circuit 903 outputs the antifuse selection signal ADDRESS_FUSE_SELECT so that the antifuse element(s) of a NOT polarity is programmed.

Figure 4:
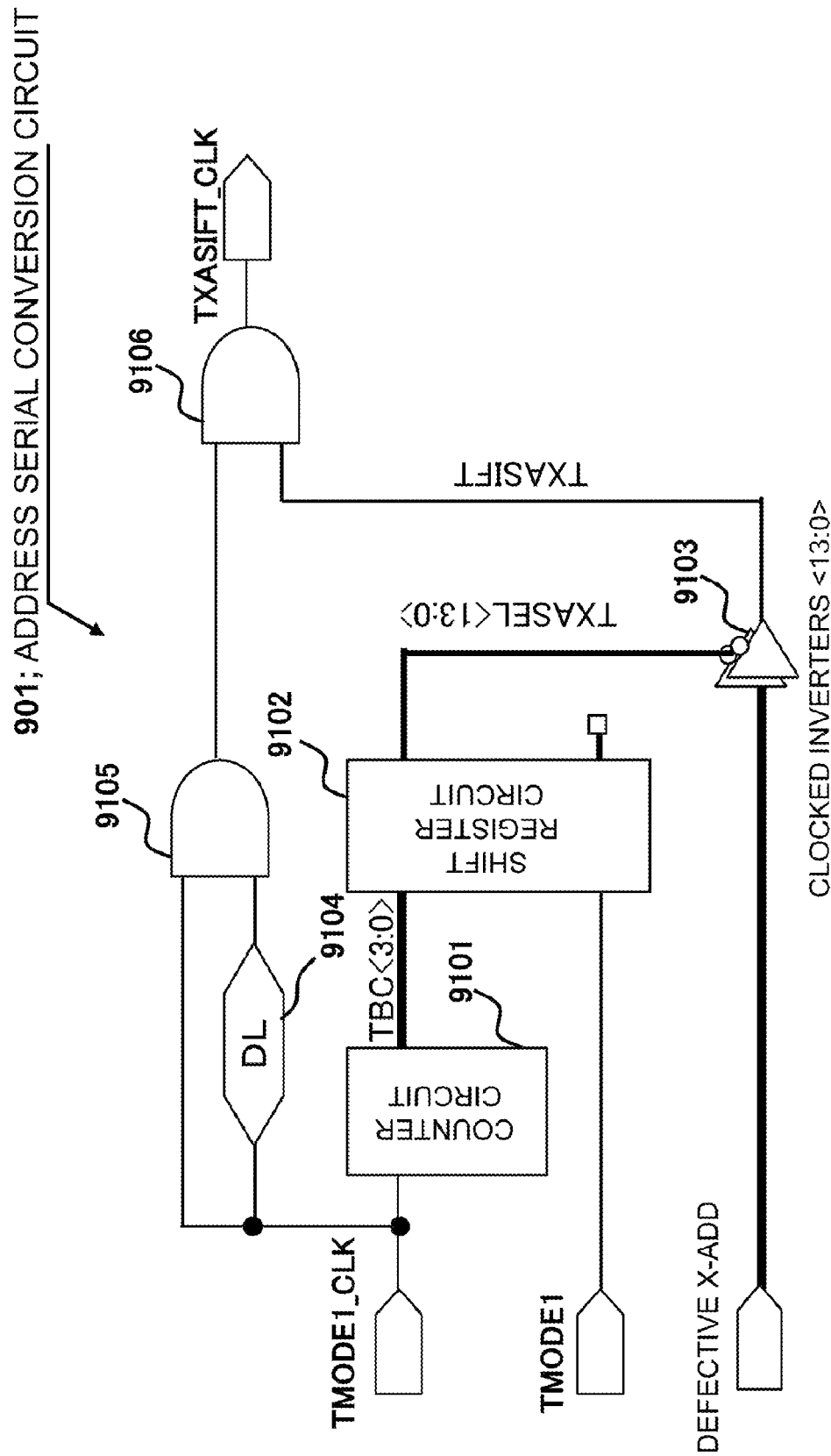
FIG. 4 is a circuit diagram showing an example of a configuration of an address serial conversion circuit 901.

FIG. 4 is a circuit diagram showing an example of a configuration of the address serial conversion circuit 901. The address serial conversion circuit 901 may include a counter circuit 9101, a shift register circuit 9102, a clocked inverter circuit 9103, a delay line 9104, and AND operation circuits (hereinafter referred to as AND circuits) 9105 and 9106.

The counter circuit 9101 receives the clock signal TMODE1_CLK, and supplies a signal TBC<3:0> of four bits to the shift register circuit 9102.

The signal TBC<3:0> supplied from the counter circuit 9101 and the test mode signal TMODE1 are supplied to the shift register circuit 9102. Then, the shift register circuit 9102 supplies a signal TXASEL<13:0> of the number of bits equivalent to that of the detective address signal to the clocked inverter circuit 9103.

The defective address signal XA<3:0> and the signal TXASEL<13:0> from the shift register circuit 9102 are supplied to the clocked inverter circuit 9103. Then, the clocked inverter circuit 9103 supplies to the AND circuit 9106 a serially converted signal TXASIFT obtained by serially converting the defective address signal XA<13:0>.

The clock signal TMODE1_CLK and the clock signal TMODE1_CLK that has been delayed through the delay line 9104 are supplied to the AND circuit 9105. Then, the AND circuit 9105 supplies an output signal to the AND circuit 9106.

The signal supplied from the AND circuit 9105 and the serially converted signal TXASIFT from the clocked inverter circuit 9103 are supplied to the AND circuit 9106. Then, the AND circuit 9106 outputs the serially converted clock signal TXASIFT_CLK.

That is, the clock signal TMODE1_CLK and defective address signals XA13 to XA0 are supplied to the address serial conversion circuit 901. Then, the address serial conversion circuit 901 converts the defective address signals XA13 to XA0 to the serially converted signal TXASIFT, in synchronization with the clock signal TMODE1_CLK.

Figure 5:
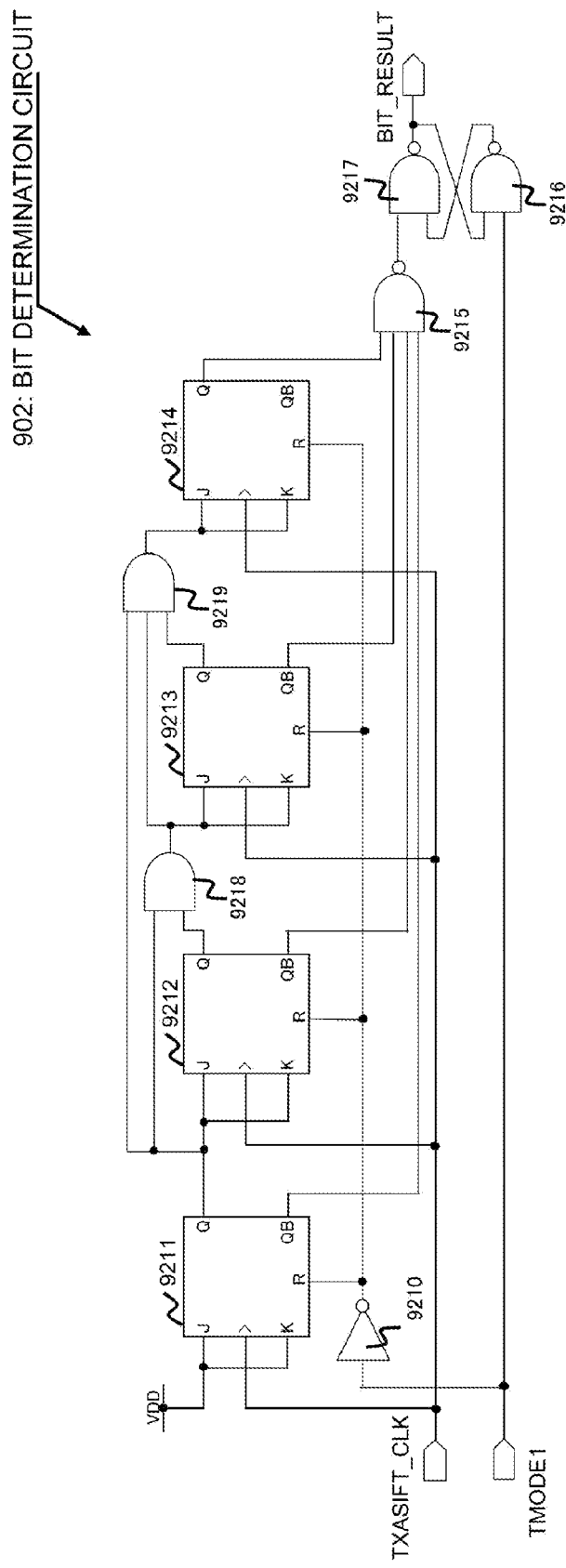
FIG. 5 is a circuit showing an example of a configuration of a bit determination circuit 902.

FIG. 5 is a circuit diagram showing an example of a configuration of the bit determination circuit 902. The bit determination circuit 902 is configured by including an inverter circuit 9210, JKFF circuits 9211 to 9214, NAND operation circuits (hereinafter referred to as NAND circuits) 9215 to 9217, and AND circuits 9218 and 9219.

The test mode signal TMODE1 is supplied to the inverter circuit 9210, and a signal /TMODE1 is supplied to an input terminal R of each of the JKFF circuits 9211 to 9214.

Input terminals J and K of the JKFF circuit 9211 are connected to a power source VDD, and the serially converted clock signal TXASIFT_CLK is supplied to a clock terminal of the JKFF circuit 9211. Then, an output signal from an output terminal Q of the JKFF circuit 9211 is supplied to input terminals J and K of the JKFF circuit 9212, and each of the AND circuits 9218 and 9219. Further, the JKFF circuit 9211 supplies an output signal from an output terminal QB to the NAND circuit 9215.

The output signal from the output terminal Q of the JKFF circuit 9211 is supplied to the input terminals J and K of the JKFF circuit 9212, and the serially converted clock signal TXASIFT_CLK is supplied to a clock terminal of the JKFF circuit 9212. Then, the JKFF circuit 9212 supplies to the AND circuit 9218 an output signal from an output terminal Q thereof. The JKFF circuit 9212 supplies to the NAND circuit 9215 an output signal from an output terminal QB thereof.

The output signal from the output terminal Q of the JKFF circuit 9211 and the output signal from the output terminal Q of the JKFF circuit 9212 are supplied to the AND circuit 9218. The AND circuit 9218 supplies a signal indicating the logical product of those signals to input terminals J and K of the JKFF circuit 9213.

The output signal of the AND circuit 9218 is supplied to the input terminals J and K of the JKFF circuit 9213, and the serially converted clock signal TXASIFT_CLK is supplied to a clock terminal of the JKFF circuit 9213. Then, the JKFF circuit 9213 supplies the AND circuit 9219 with an output signal from an output terminal Q thereof, and supplies the NAND circuit 9215 with an output signal from an output terminal QB thereof.

An output signal of the AND circuit 9219 is supplied to input terminals J and K of the JKFF circuit 9214, and the serially converted clock signal TXASIFT_CLK is supplied to a clock terminal of the JKFF circuit 9214. Then, the JKFF circuit 9214 supplies the NAND circuit 9215 with an output signal from an output terminal Q thereof.

As described above, the output signals from the output terminals QB of the JKFF circuits 9211 to 9213 and the output signal from the output terminal Q of the JKFF circuit 9214 are supplied to the NAND circuit 9215. The NAND circuit 9215 supplies an output signal to the NAND circuit 9217.

The test mode signal TMODE1 and an output signal of the NAND circuit 9217 are supplied to the NAND circuit 9216. The NAND circuit 9216 supplies an output signal to the NAND circuit 9217.

The output signal of the NAND circuit 9215 and the output signal of the NAND circuit 9216 are supplied to the NAND circuit 9217. The NAND circuit 9217 supplies the output signal to the NAND circuit 9216. Then, the NAND circuit 9217 outputs the bit determination result signal BIT_RESULT configured to determine the number of times of the high level (the number of high level bits) in the serially converted clock signal TXASIFT_CLK. In some embodiments, the bit determination circuit 902 outputs the bit determination result signal BIT_RESULT of a high level (logic level of "1") when the number of times of the high level in the serially converted clock signal TXASIRF_CLK is equal to or more than the number of bits (such as 8 bits) of the threshold value.

Figure 6:
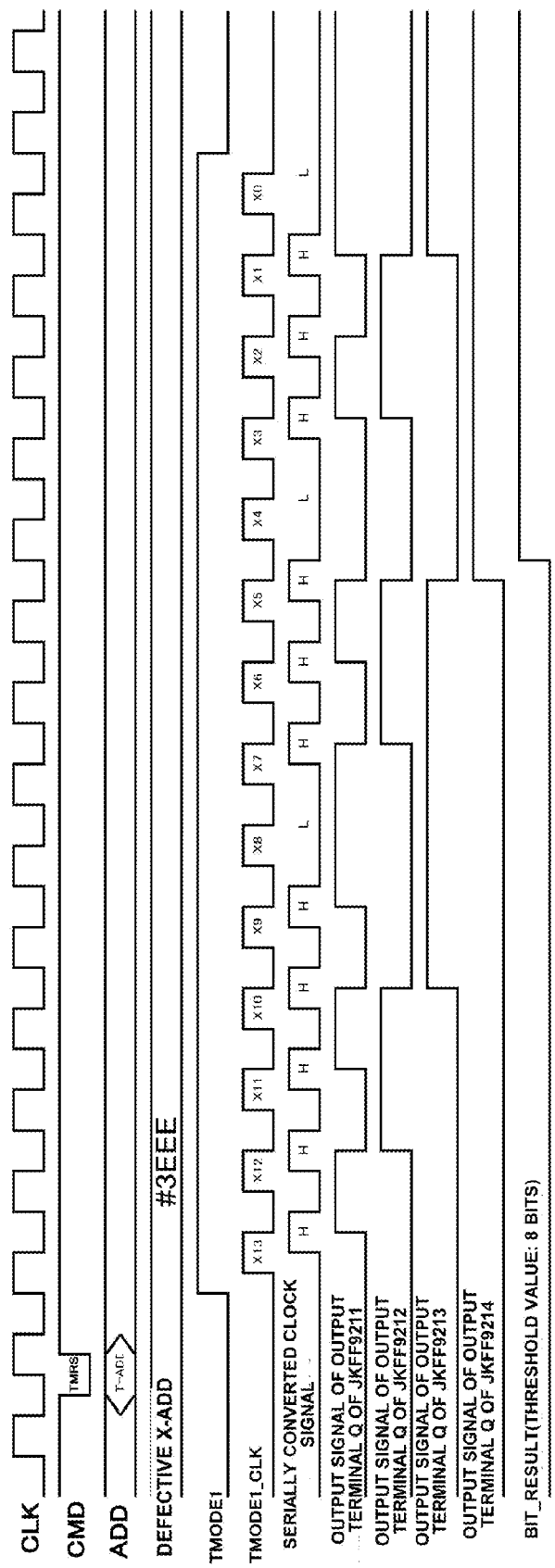
FIG. 6 is a timing diagram of input and output signals of the address serial conversion circuit 901 and the bit determination circuit 902.

FIG. 6 is a timing diagram of the input/output signals of the address serial conversion circuit 901 and the bit determination circuit 902 when a defective address signal is "#3EEE". When the defective address signal is "#3EEE" and when the defective address signal "#3EEE" (hexadecimal number) is expressed in binary numbers, "11111011101110" is obtained. Then, bits of the serially converted clock signal TXASIFT_CLK transition is in the order of "11111011101110", as shown in FIG. 6. Then, when the number of times of the high level (number of high level bits) of the serially converted clock signal is equal to or more than the number of bits (such as 8 bits) of the threshold value in the case of FIG. 6, for example, a high level signal (logic level of "1") is output as the bit determination result signal BIT_RESULT. Since bits of A14 and A15 are not needed in this example, the description is given, omitting 00 that have been expressed in binary numbers and correspond to high-order two bits.

FIG. 7 is a table showing a correspondence relationship between each defective address to be relieved and the bit determination result signal BIT_RESULT. A case where the defective address to be relieved is "#236A" (hexadecimal number), for example, is discussed below. When the defective address "#236A" is expressed in binary numbers in that case, "10001101101010" is obtained. For that reason, when the defective address signal is "#236A" (hexadecimal number), the number of times of the high level (number of high level bits) in the serially converted clock signal TXASIFT_CLK is 7 times (7 bits), as shown in FIG. 7. Accordingly, when the number of bits of the threshold value is set to 8 bits, a low level signal (logic level of "0") is output as the bit determination result signal BIT_RESULT.

On the other hand, another case where the defective address signal is "#3667" (hexadecimal number), for example, is discussed. When the defective address "#3667" is expressed in binary numbers, "11011001100111" is obtained. For that reason, when the defective address signal is "#3667" (hexadecimal number), the number of times of the high level (number of high level bits) in the serially converted clock signal TXASIFT_CLK is 9 times (9 bits), as shown in FIG. 7. Accordingly, when the number of the bits of the threshold value is set to 8 bits, a high level signal (logic level of "1") is output as the bit determination result signal BIT_RESULT.

When the number of times of the high level (number of high level bits) in the serially converted clock signal TXAS-IFT_CLK is less than the predetermined threshold value (8 bits in the case of FIG. 7) as shown in FIG. 7, the antifuse elements of the TRUE-side polarity are selected. Then, the antifuses of the selected antifuse elements of the TRUE-side polarity corresponding to the high level bits of the defective address are programmed. In this case, the number of high level bits in the binary expression "10001101101010" of the above-mentioned defective address signal of "#236A" is less than 8. Thus, the antifuses of the TRUE-side polarity are selected, and the antifuses corresponding to the high level 7 bits are programmed.

On the other hand, when the number of times of the high level (number of high level bits) in the serially converted clock signal TXASIFT_CLK is equal to or more than the predetermined threshold value (8 bits in the case of FIG. 7) as shown in FIG. 7, the antifuse element(s) of the NOT-side polarity are selected. Then, only the antifuses corresponding to low level bits of the defective address are programmed. For example, since the binary expression of the above-mentioned defective address signal of "#3667" is "11011001100111", 8 or more high-level bits are present. Thus, the antifuses of the NOT-side polarity are selected, and only the antifuses corresponding to 5 bits, which is the number of high level bits in "00100110011000" obtained by inverting "11011001100111", are programmed.

As described above, in the semiconductor device 1 according to this embodiment, a defective memory cell is relieved, using the redundancy circuit including at least the one or two antifuse elements. On that occasion, the semiconductor device 1 according to this embodiment selects the antifuse element(s) to be programmed, based on a result of the comparison between the number of high level bits in the defective address and the predetermined threshold value. The selection is made in order to increase the success rate of programming the antifuse element(s) and to reduce the number of the antifuse elements to be simultaneously programmed. Consequently, the semiconductor device 1 according to this embodiment contributes to efficiently relieving the defective memory cell.

In this manner, even if a defective address is caused by a stress during the course of a process from a wafer dicing operation to packaging of a semiconductor device (such as a memory chip), the defective address can be relieved (secondarily relieved) after the packaging in a short period of time. In this semiconductor device, a defective address has been relieved (primarily relieved) using a probe card in a test (PW test) in a wafer state, so that the semiconductor device has been evaluated as a non-defective product. According to the present application, the defective address caused in this non-defective product semiconductor device can be relieved after the packaging in the short period of time. In a semiconductor device in which a program element is programmed using a high voltage generated in a circuit inside the chip, the amount of current that can be generated inside the chip is limited.

[Second Embodiment]

A second embodiment will be described in detail, using the drawings.

In the second embodiment, a defective address signal is detected, based on a result of the comparison between write data and read data. In the description about the second embodiment, description of a portion overlapping the above-mentioned first embodiment will be omitted. Further, in the description about the second embodiment, same reference signs are assigned to components that are the same as those in the above-mentioned first embodiment, thereby omitting description of the components that are the same as those in the above-mentioned first embodiment.

Figure 8:
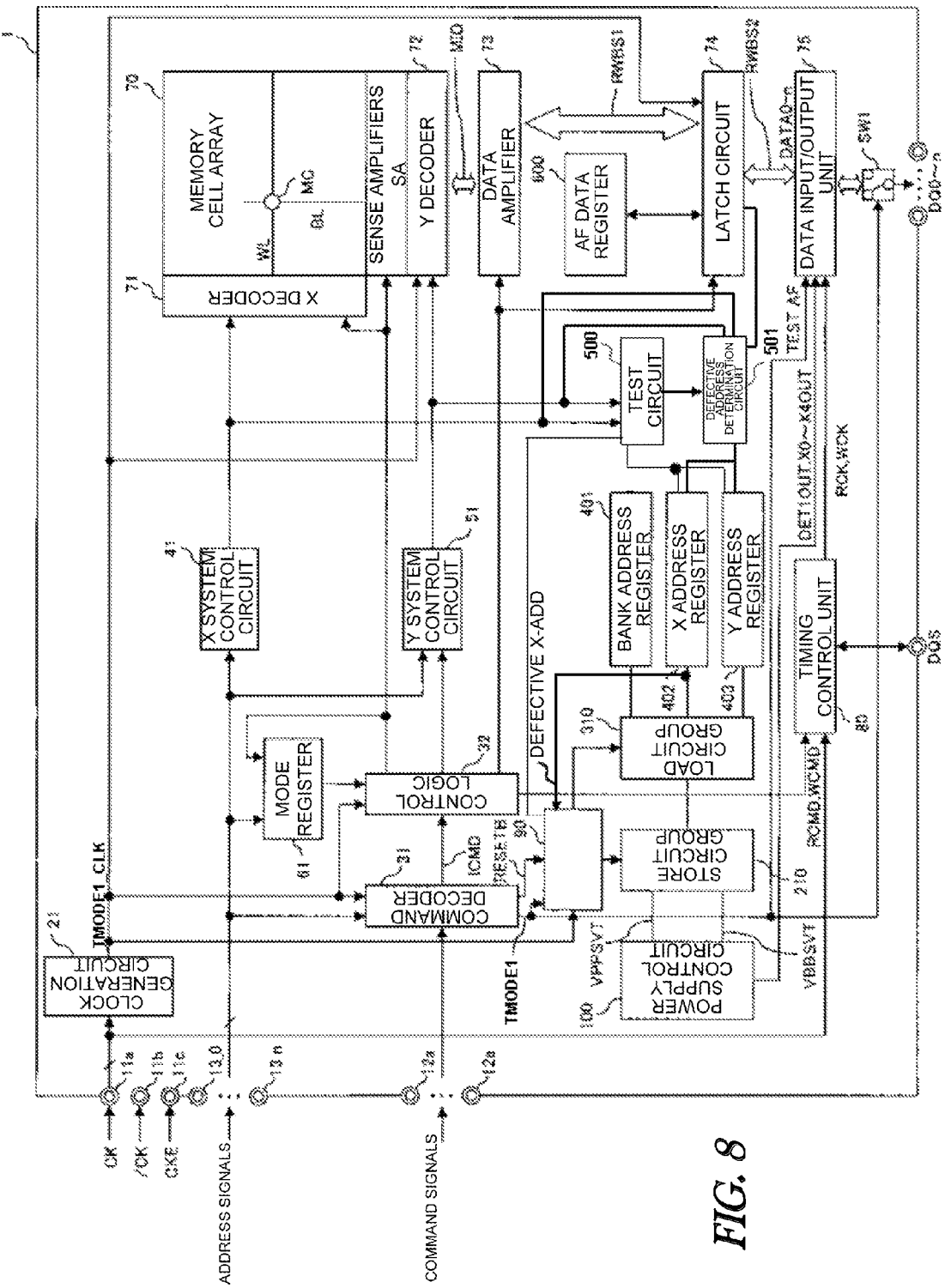
FIG. 8 is a block diagram showing an example of an overall configuration of a semiconductor device 1 according to a second embodiment.

FIG. 8 is a block diagram showing an example of an overall configuration of a semiconductor device 1 according to the second embodiment. The semiconductor device 1 shown in FIG. 8 is different from the semiconductor device 1 shown in FIG. 2 in that the semiconductor device 1 shown in FIG. 8 includes a defective address determination circuit 501.

The defective address determination circuit 501 is disposed between a test circuit 500 and each of a bank address register 401, an X address register 402, and a Y address register 403. The defective address determination circuit 501 performs an AND operation (AND operation) between write data and read data supplied from the latch circuit 74. Then, the defective address determination circuit 501 supplies an address whose AND operation result shows a mismatch to each of the bank address register 401, the X address register 402, and the Y address register 403, as a defective address signal.

As described above, in the semiconductor device 1 according to this embodiment, the defective address signal is determined inside the semiconductor device 1. Accordingly, in the semiconductor device 1 according to this embodiment, there is no need for supplying a test address from an outside of the semiconductor device 1. Consequently, the semiconductor device 1 according to this embodiment contributes to efficiently relieving a defective memory cell.

[Third Embodiment]

A third embodiment will be described in detail, using the drawings.

In this embodiment, capability of an internal power source for programming an antifuse element(s) is controlled, according to a defective address signal. In the description about this embodiment, description of a portion overlapping the above-mentioned embodiment(s) will be omitted. Further, in the description about this embodiment, same reference signs are assigned to components that are the same as those in the above-mentioned embodiment(s), thereby omitting description of the components that are the same as those in the above-mentioned embodiment(s).

Figure 9:
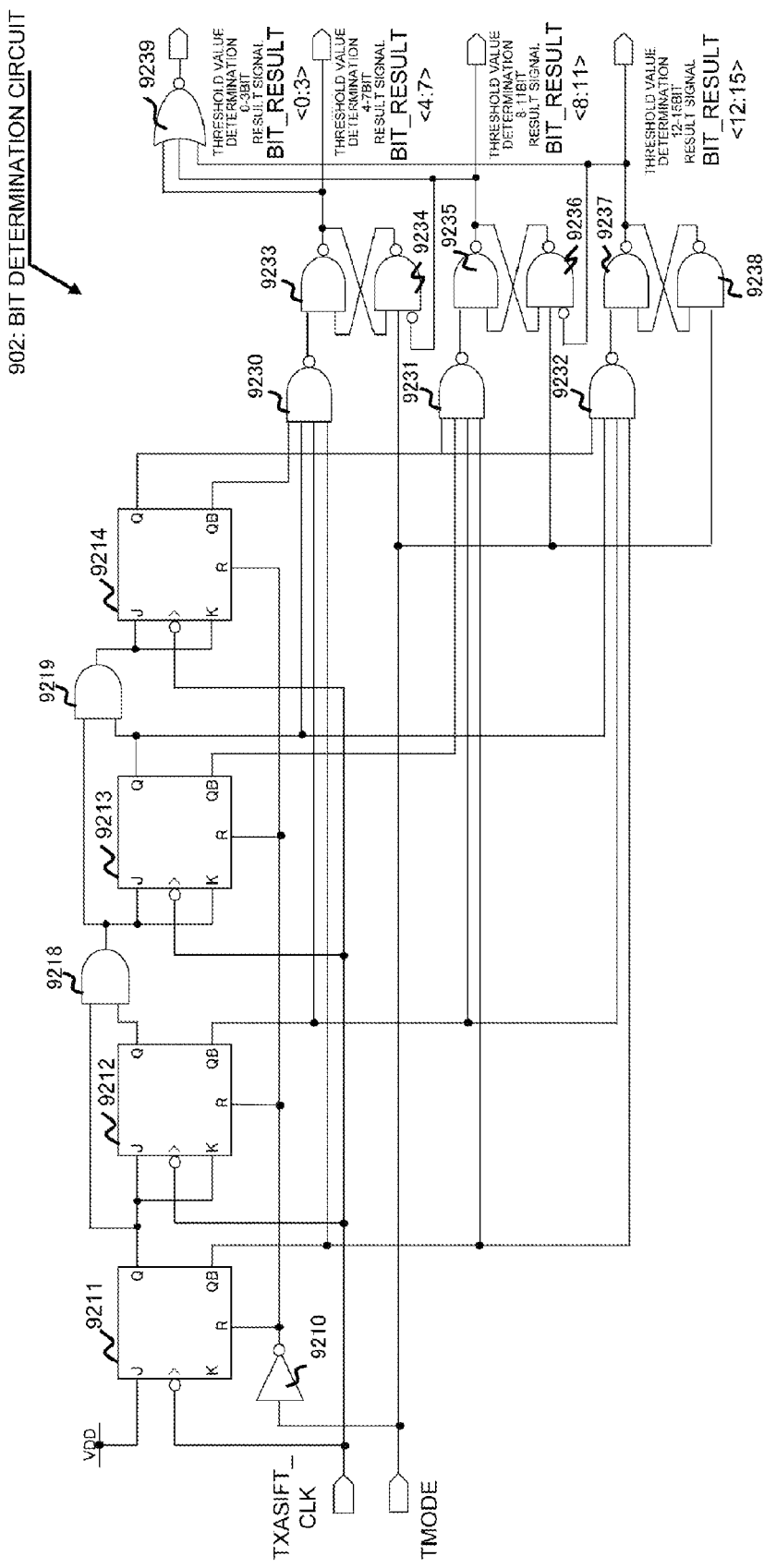
FIG. 9 is a circuit diagram showing an example of a configuration of a bit determination circuit 902 according to a third embodiment.

FIG. 9 is a circuit diagram showing an example of a configuration of a bit determination circuit 902 according to this embodiment. The bit determination circuit 902 according to this embodiment is configured by including an inverter circuit 9210, JKFF circuits 9211 to 9214, AND circuits 9218 and 9219, NAND circuits 9230 to 9238, and an NOR circuit (hereinafter referred to as the NOR circuit) 9239. Since the inverter circuit 9210, the JKFF circuits 9211 to 9214, and the AND circuits 9218 and 9219 are the same as those in FIG. 5, detailed description of these circuits will be omitted.

An output signal from an output terminal QB of each of the JKFF circuits 9211, 9212 and 9214 and an output signal from an output terminal Q of the JKFF circuit 9213 are supplied to the NAND circuit 9230. Then, the NAND circuit 9230 supplies an output signal to the NAND circuit 9233.

The output signal from the output terminal QB of each of the JKFF circuits 9211 and 9212, an output signal from an output terminal QB of the JKFF circuit 9213, and an output signal from an output terminal Q of the JKFF circuit 9214 are supplied to the NAND circuit 9231. Then, the NAND circuit 9231 supplies an output signal to the NAND circuit 9235.

The output signal from the output terminal QB of each of the JKFF circuits 9211 and 9212 and the output signal from the output terminal Q of each of the JKFF circuits 9213 and

9214 are supplied to the NAND circuit 9232. Then, the NAND circuit 9232 supplies an output signal to the NAND circuit 9237.

Since the relationship between the NAND circuits 9233 and 9234 is the same as the relationship between the NAND circuits 9216 and 9217 shown in FIG. 5, detailed description of the relationship between the NAND circuits 9233 and 9234 will be omitted. Since the relationship between the NAND circuits 9235 and 9236 is the same as the relationship between the NAND circuits 9216 and 9217 shown in FIG. 5, detailed description of the relationship between the NAND circuits 9235 and 9236 will be omitted. Since the relationship between the NAND circuits 9237 and 9238 is the same as the relationship between the NAND circuits 9216 and 9217 shown in FIG. 5, detailed description of the relationship between the NAND circuits 9237 and 9238 will be omitted.

Outputs of the NAND circuits 9233, 9235, and 9237 are supplied to the NOR circuit 9239. Then, the NOR circuit 9239 determines the number of bits at a high level in 0 to 3 bits of a serially converted clock signal TXASIFT_CLK, and outputs a bit determination result signal BIT_RESULT<0:3>.

The NAND circuit 9233 determines the number of high level bits in 4 to 7 bits of the serially converted clock signal TXASIFT_CLK, and outputs a bit determination result signal BIT_RESULT<4:7>.

The NAND circuit 9235 determines the number of high level bits in 8 to 11 bits of the serially converted clock signal TXASIFT_CLK, and outputs a bit determination result signal BIT_RESULT<8:11>.

The NAND circuit 9237 determines the number of high level bits in 12 to 15 bits of the serially converted clock signal TXASIFT_CLK, and outputs a bit determination result signal BIT_RESULT<12:15>.

Then, a power supply control circuit 100 according to this embodiment controls a voltage of the internal power source, according to the bit determination result signal output by the bit determination circuit 902. As a result, the power supply control circuit 100 can supply an antifuse element(s) with the voltage necessary for programming the antifuse element(s) according to a defective address signal.

That is, the bit determination circuit 902 outputs two or more bit determination result signals associated with respective two or more determination threshold values. Then, the power supply control circuit 100 controls the voltage of the internal power source according to one of the two or more bit determination result signals at a high level.

FIG. 10 is a table showing a correspondence relationship between each defective address to be relieved and the bit determination result signal BIT_RESULT. As shown in FIG. 10, the AF control circuit 90 shown in FIG. 10 may perform controlling so that the ability of the power supply control circuit 100 is changed according to a result of the comparison between the bit determination result signal BIT_RESULT and the predetermined threshold value.

As described above, the power supply ability in the semiconductor device 1 according to this embodiment is changed according to the number of times of the high level in the defective address to be relieved and the predetermined threshold value. Consequently, a defective memory cell can be efficiently relived in the semiconductor device 1 in this embodiment.

[Fourth Embodiment]

A fourth embodiment will be described in detail using the drawings.

In this embodiment, the priority order of a fuse set(s) is determined so that the number of antifuse elements to be programmed is reduced in a post-process. In the description about this embodiment, description of a portion overlapping the above-mentioned embodiment(s) will be omitted. Further, in the description about this embodiment, same reference signs are assigned to components that are the same as those in the above-mentioned embodiment(s), thereby omitting description of the components that are the same as those in the above-mentioned embodiment(s).

Also when a defective memory cell of a DRAM or the like after assembly (in a so-called post-process) is relieved, an antifuse element(s) can be used to relieve the defective memory cell.

Then, a selection control circuit 903 according to this embodiment determines the priority order of an antifuse element(s) based on an output signal of a bit determination circuit 902.

Specifically, the selection control circuit 903 determines the priority order of an antifuse element(s) (a program element(s)), based on whether the number of times of a high level to be counted by the bit determination circuit 902 is equal to or higher than a predetermined determination threshold value. More specifically, when the number of times of the high level to be counted by the bit determination circuit 902 is equal to or higher than the determination threshold value, the selection control circuit 903 prioritizes the antifuse element(s) (the program element(s)) of a NOT-side polarity. On the other hand, when the number of times of the high level to be counted by the bit determination circuit 902 is less than the determination threshold value, the selection control circuit 903 prioritizes the antifuse element(s) (the program element(s)) of a TRUE-side polarity.

That is, the priority order of the program element(s) is determined according to the number of high level bits in a serially converted clock signal TXASIFT_CLK. More specifically, when the number of the high level bits in the serially converted clock signal TXASIFT_CLK is equal to or higher than the predetermined threshold value, the AF control circuit 90 determines the priority order of the program element(s) of the TRUE-side polarity. On the other hand, when the number of the high level bits in the serially converted clock signal TXASIFT_CLK is less than the predetermined threshold value, the AF control circuit 90 determines the priority order of the program element(s) of the NOT-side polarity. Then, the antifuse element(s) having a higher priority order is used in preference.

FIG. 11 is a table showing the priority order of the antifuse element(s). Assuming, for example, that 16 fuse sets (AF ROW SET0 to AF ROW SETF) using the antifuse element(s) capable of relieving X address(es) is present. Then, assuming that, in the case of FIG. 11, 8 fuse sets of the TRUE-side polarity (AF ROW SET0 to AF ROW SET7) to be programmed when a bit of a defective address signal is high. Further, assuming that, in the case of FIG. 11, 8 fuse sets of the NOT-side polarity (AF ROW SET8 to AF ROW SETF) to be programmed when the bit of the defective address signal is low. In that case, the selection control circuit 903 determines the priority order of the fuse set(s) according to the number of high level bits in the serially converted clock signal TXASIFT_CLK, as shown in FIG. 11.

Even if the polarity of the fuse set(s) for programming an address is divided into two types, the AF control circuit 90 compares address data supplied from an outside and address data that has been relieved, when in normal use. Then, the AF control circuit 90 operates a redundancy circuit when the address data supplied from the outside and the relieved address data match.

FIG. 12 is a table showing an example when a defective address signal is relieved using the fuse sets shown in FIG. 11.

Specifically, FIG. 12 is the table showing the example when a defective address signal "#3EEE" is relieved using the fuse sets of the NOT-side polarity shown in FIG. 11. In the case of FIG. 12, four antifuse elements should be programmed by using the fuse sets of the NOT-side polarity.

FIG. 13 is a table showing the priority order of fuse set(s). Assuming, for example, that 16 fuse sets using the antifuse element(s) capable of relieving each X address are present. In that case, the upper limit of the number of defective addresses that can be relieved is 16. Then, when the number of high level bits in the serially converted clock signal TXASIFT_CLK is less than the predetermined threshold value, a fuse set SET0 of the TRUE-side polarity is used with the highest priority. On the other hand, when the number of high level bits in the serially converted clock signal TXASIFT_CLK is equal to or higher than the predetermined threshold value, a fuse set SET8 of the NOT-side polarity is used with the highest priority.

FIG. 14 is a table associating defective addresses with bit determination results and the priority orders of the polarities of the fuse sets. Specifically, FIG. 14 shows that the priority order of the polarity of the fuse set(s) can be switched, based on a bit determination result.

As described above, in the semiconductor device 1 according to this embodiment, a redundancy circuit, in which the number of the antifuse elements to be programmed is reduced in the post-process, is preferentially used. As a result, in the semiconductor device 1 according to this embodiment, the number of the antifuse elements to be simultaneously programmed is reduced, thereby efficiently contributing to relief of a defective memory cell.

In this manner, even if a defective address is caused by a stress during the course of a process from a wafer dicing operation to packaging of a semiconductor device (such as a memory chip), the defective address can be relieved (secondarily relieved) after the package assembly process in a short period of time. In this semiconductor device, a defective address has been relieved (primarily relieved) using a probe card in a test (PW test) in a wafer state, so that the semiconductor device has been evaluated as a non-defective product. According to the present application, the defective address caused in this non-defective product semiconductor device can be relieved after the package assembly process in the short period of time.

In a semiconductor device in which a program element is programmed using a high voltage generated in a circuit inside the chip, the amount of current that can be generated inside the chip is limited. Thus, the present application is effective for such a semiconductor device.

[Fifth Embodiment]

A fifth embodiment will be described in detail, using the drawings.

In this embodiment, the polarity of the fuse set(s) in a redundancy circuit is switched so that the number of antifuse elements to be programmed in a post-process is reduced. In the description about this embodiment, description of a portion overlapping the above-mentioned embodiment(s) will be omitted. Further, in the description about this embodiment, same reference signs are assigned to components that are the same as those in the above-mentioned embodiment(s), thereby omitting description of the components that are the same as those in the above-mentioned embodiment(s). As described above, the redundancy circuit corresponds to the STORE circuit group 210 shown in FIG. 2.

A selection control circuit 903 according to this embodiment receives a defective address signal. In addition to that, the selection control circuit 903 changes the polarity of an antifuse element(s) (a program element(s)) to be programmed and data on a defective address to be stored in the redundancy circuit, according to whether or not the number of times of a high level in the defective address signal is equal to or higher than a predetermined determination threshold value.

In some embodiments, when the number of times of the high level is equal to or higher than the predetermined determination threshold value, the selection control circuit 903 programs the antifuse element(s) (the program element(s)) of a NOT-side polarity, inverts the received defective address signal, and supplies the inverted defective address signal to the redundancy circuit. When the number of times of the high level is less than the predetermined determination threshold value, the selection control circuit 903 programs the antifuse element(s) (program element(s)) of a TURE-side polarity, and supplies the value of the received defective address signal to the redundancy circuit.

Figure 15:
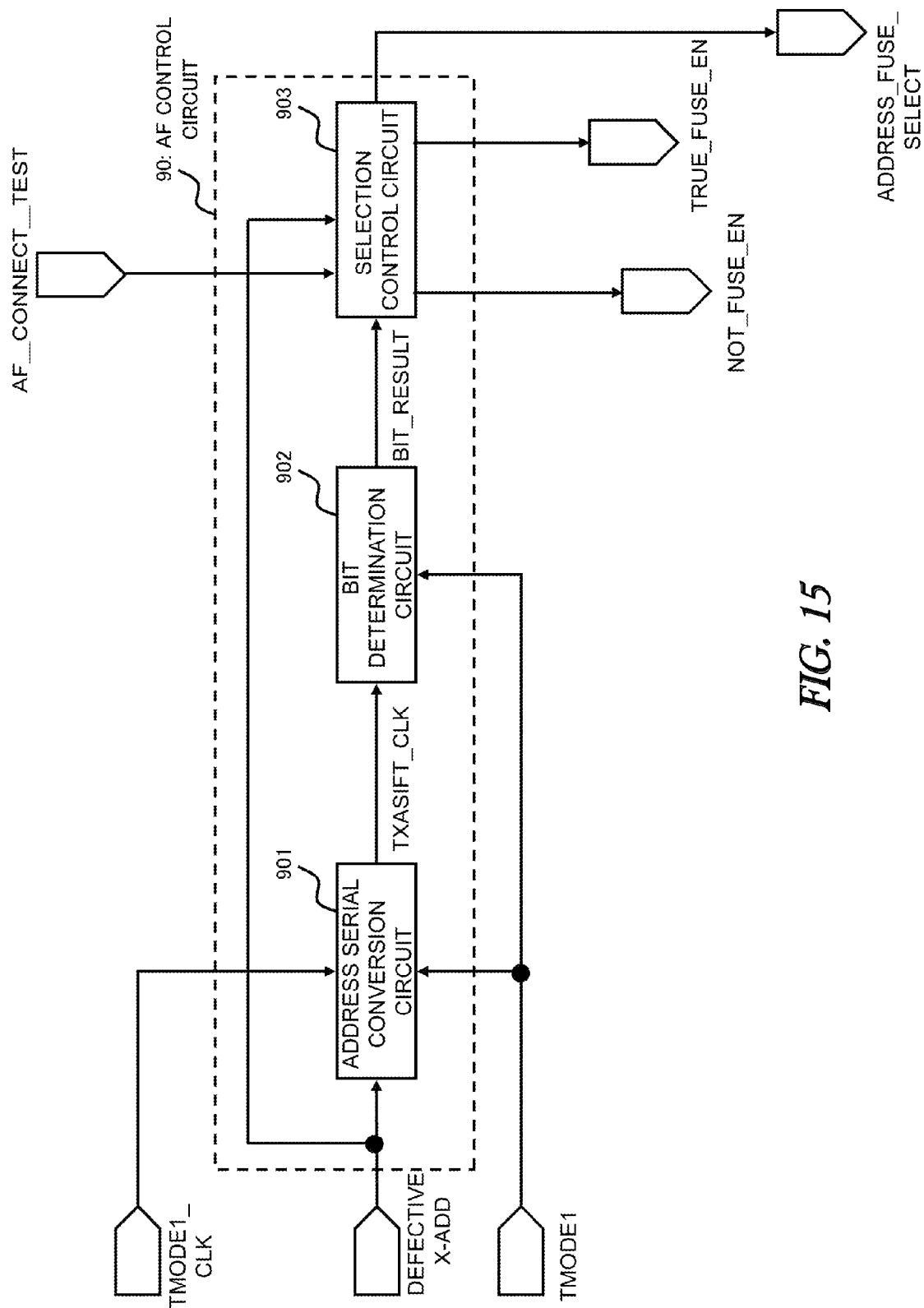
FIG. 15 is a block diagram showing an example of a configuration of an AF control circuit 90 according to a fifth embodiment.

FIG. 15 is a block diagram showing an example of a configuration of an AF control circuit 90 according to this embodiment. The AF control circuit 90 shown in FIG. 15 is different from the AF control circuit 90 shown in FIG. 3 in that the AF control circuit 90 shown in FIG. 15 includes the selection control circuit 903. The selection control circuit 903 changes the antifuse element(s) to be programmed and the data on the defective address to be transferred to the redundancy circuit, according to the defective address signal.

Figure 16:
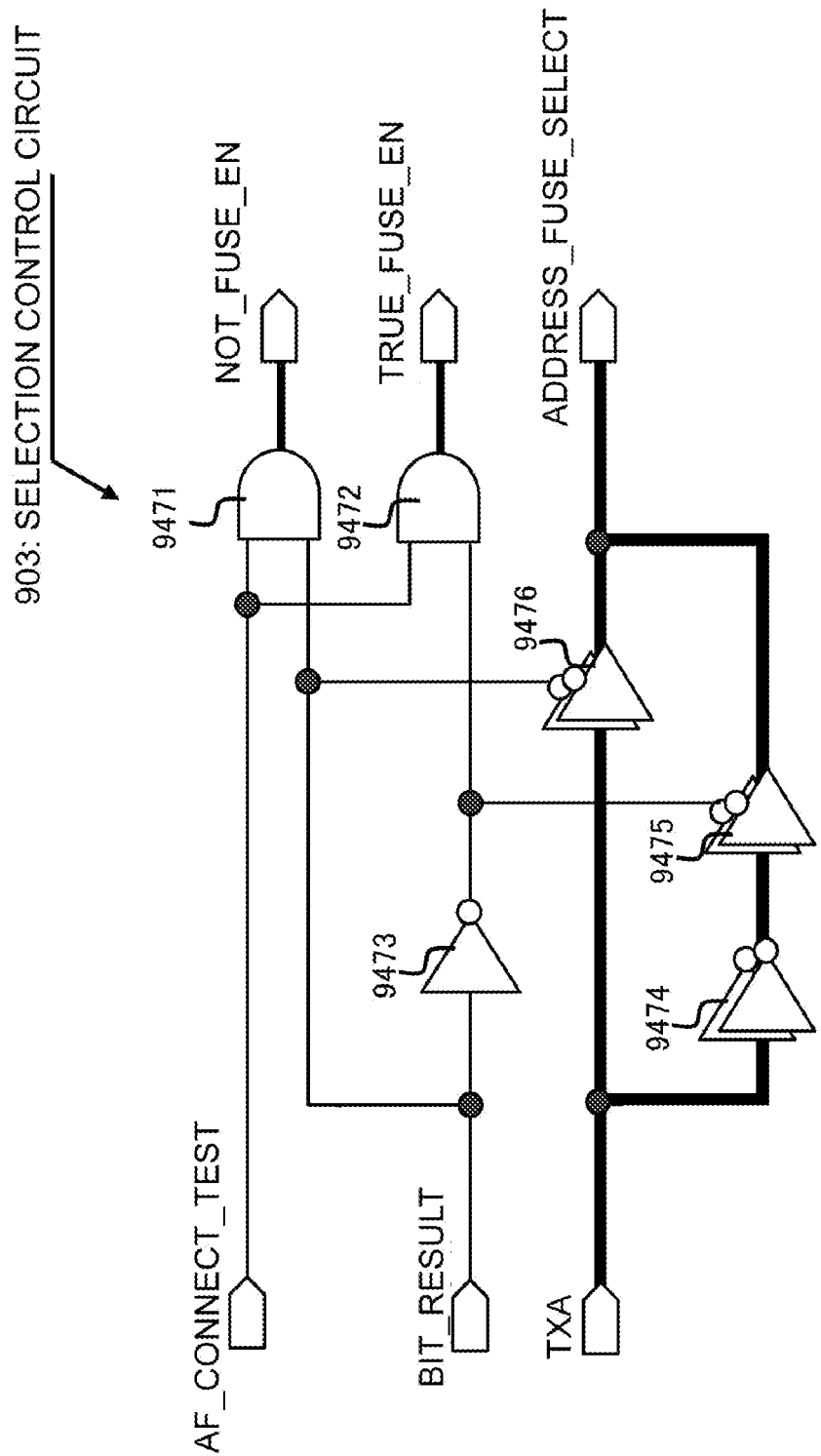
FIG. 16 is a circuit diagram showing an example of a configuration of a selection control circuit 903.

FIG. 16 is a circuit diagram showing an example of a configuration of the selection control circuit 903. The selection control circuit 903 may include AND circuits 9471 and 9472, an inverter circuit 9473, and clocked inverter circuits 9474 to 9476.

An AF programming test signal AF_CONNECT_TEST and a bit determination result signal BIT_RESULT supplied from a bit determination circuit 902 are supplied to the AND circuit 9471. Then, the AND circuit 9471 outputs an output signal as a NOT fuse enable signal NOT_FUSE_EN. The AF programming test signal AF_CONNECT_TEST goes high when the polarity of a fuse set(s) in the redundancy circuit is selected. Thus, when the polarity of the fuse set(s) in the redundancy circuit is selected and when the bit determination result signal BIT_RESULT is high, the AND circuit 9471 outputs the NOT fuse enable signal NOT_FUSE_EN at a high level.

The inverter circuit 9473 supplies a signal /BIT_RESULT to the AND circuit 9472 and also supplies the signal /BIT_RESULT to the clocked inverter circuit 9475 as a control signal.

The AF programming test signal AF_CONNECT_TEST and the signal /BIT_RESULT supplied from the inverter circuit 9473 are fed to the AND circuit 9472. Then, the AND circuit 9472 outputs an output signal as a TRUE fuse enable signal TRUE_FUSE_EN. As described above, the AF programming test signal AF_CONNECT_TEST goes high when the polarity of a fuse set(s) in the redundancy circuit is selected. Thus, when the polarity of the fuse set(s) in the redundancy circuit is selected and when the signal /BIT_RESULT is "0", the AND circuit 9472 outputs the TRUE fuse enable signal TRUE_FUSE_EN at a high level.

A defective address signal TXA is supplied to the clocked inverter circuit 9474. Then, when the defective address signal TXA is high, the inverter circuit 9474 supplies a signal /TXA to the clocked inverter circuit 9475.

The signal /TXA from the clocked inverter circuit 9474 and the signal /BIT_RESULT from the inverter circuit 9473 are supplied to the clocked inverter circuit 9475. Then, when the bit determination signal BIT_RESULT is low (or when the signal /BIT_RESULT is high), the clocked inverter circuit

9475 outputs the defective address signal TXA as an antifuse selection signal ADDRESS_FUSE_SELECT.

The defective address signal TXA is supplied to the clocked inverter circuit 9476 as an input, and the bit determination result signal BIT_RESULT is supplied to the clocked inverter circuit 9476 as a control signal. Then, when the bit determination signal BIT_RESULT is high, the clocked inverter circuit 9476 outputs the signal /TXA as the antifuse selection signal ADDRESS_FUSE_SELECT.

Accordingly, the selection control circuit 903 according to this embodiment programs an antifuse element(s) of the NOT-side polarity when the number of high level bits in a serially converted clock signal TXASIFT_CLK is equal to or higher than the predetermined threshold value, and inverts the detective address signal to be transferred to the redundancy circuit. Further, when the number of high level bits in the serially converted clocked signal TXASIFT_CLK is less than the predetermined threshold value, the selection control circuit 903 according to this embodiment programs an antifuse element(s) of the TRUE-side polarity, and transfers the defective address signal to the redundancy circuit, without alteration.

Figure 17:
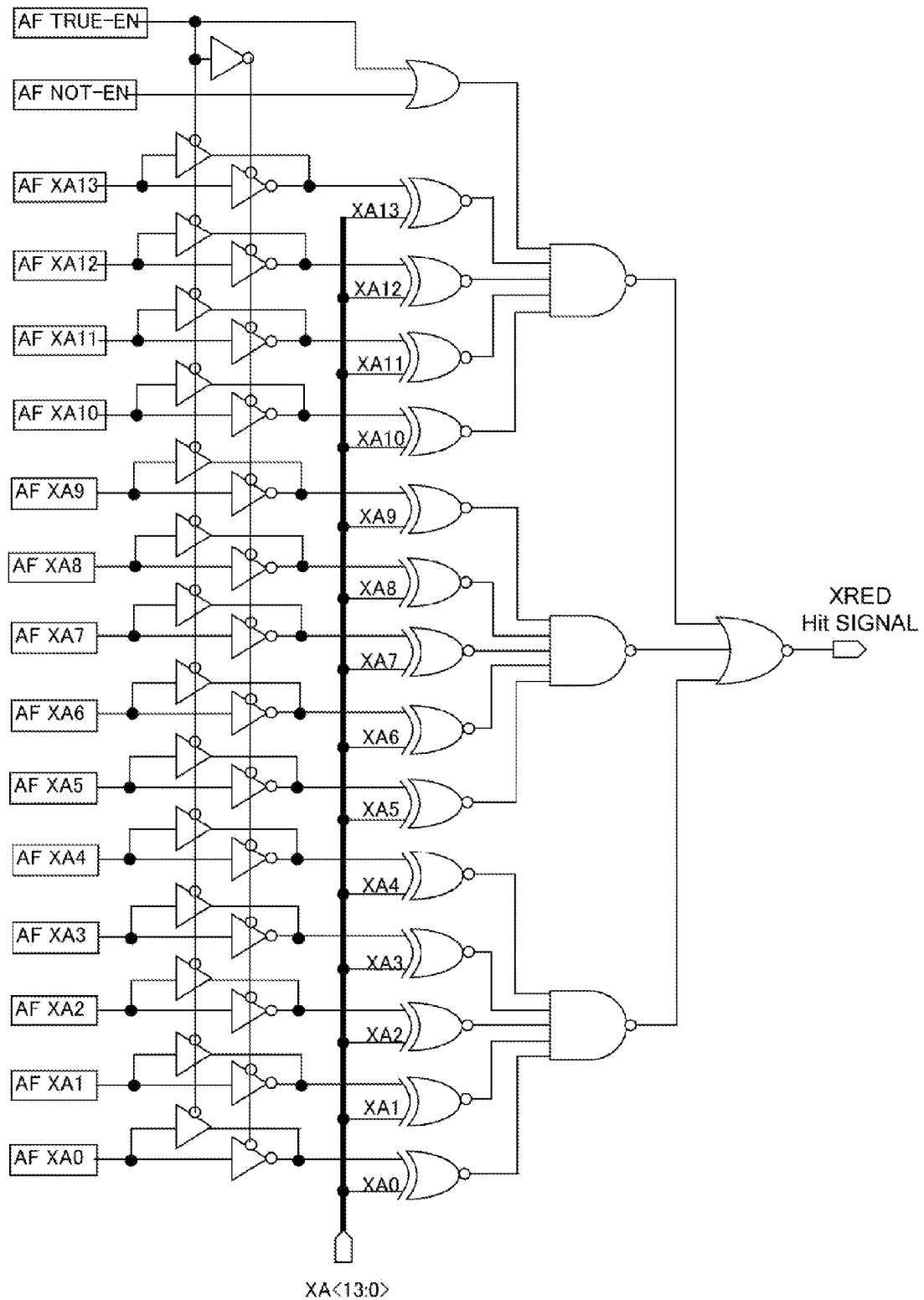
FIG. 17 is a circuit diagram showing an example of a circuit including an antifuse element(s) of a TRUE-side polarity and an antifuse element(s) of a NOT-side polarity in a redundancy circuit.

FIG. 17 is a circuit diagram showing an example of a circuit including the antifuse element(s) of the TRUE-side polarity and the antifuse element(s) of the NOT-side polarity in the redundancy circuit. In the case of the circuit shown in FIG. 17, by programming the antifuse element of one of the TRUE-side polarity and the NOT-side polarity, the redundancy circuit can be enabled.

FIG. 18 is a table associating each defective address with a bit determination result, selection of the polarity of an antifuse element(s), and the total number of the antifuse element(s) to be programmed. FIG. 18 shows the total number of the antifuse elements to be programmed in the semiconductor device 1 according to this embodiment can be reduced from the number of bits of each defective address.

As described above, in the semiconductor device 1 according to this embodiment, the antifuse element(s) to be programmed is switched, according to the defective address. Consequently, the number of the antifuse elements to be simultaneously programmed can be reduced in the semiconductor device 1 according to this embodiment, thereby contributing to efficiently relieving a defective memory cell.

[Sixth Embodiment]

A sixth embodiment will be described in detail, using the drawings.

In this embodiment, the upper limit of the number of antifuse elements to be programmed is reduced when a defective address signal is time-divided to be relieved. In the description about this embodiment, description of a portion overlapping the above-mentioned embodiment(s) will be omitted. Further, in the description about this embodiment, same reference signs are assigned to components that are the same as those in the above-mentioned embodiment(s), thereby omitting description of the components that are the same as those in the above-mentioned embodiment(s).

A selection control circuit 903 according to this embodiment programs an antifuse element(s) (a program element(s)) in time division. Then, according to the total number of the antifuse elements (program elements) to be programmed, the selection control circuit 903 also changes the number of antifuse elements (the number of program elements) to be programmed at each timing of programming the antifuse element(s).

Figure 19:
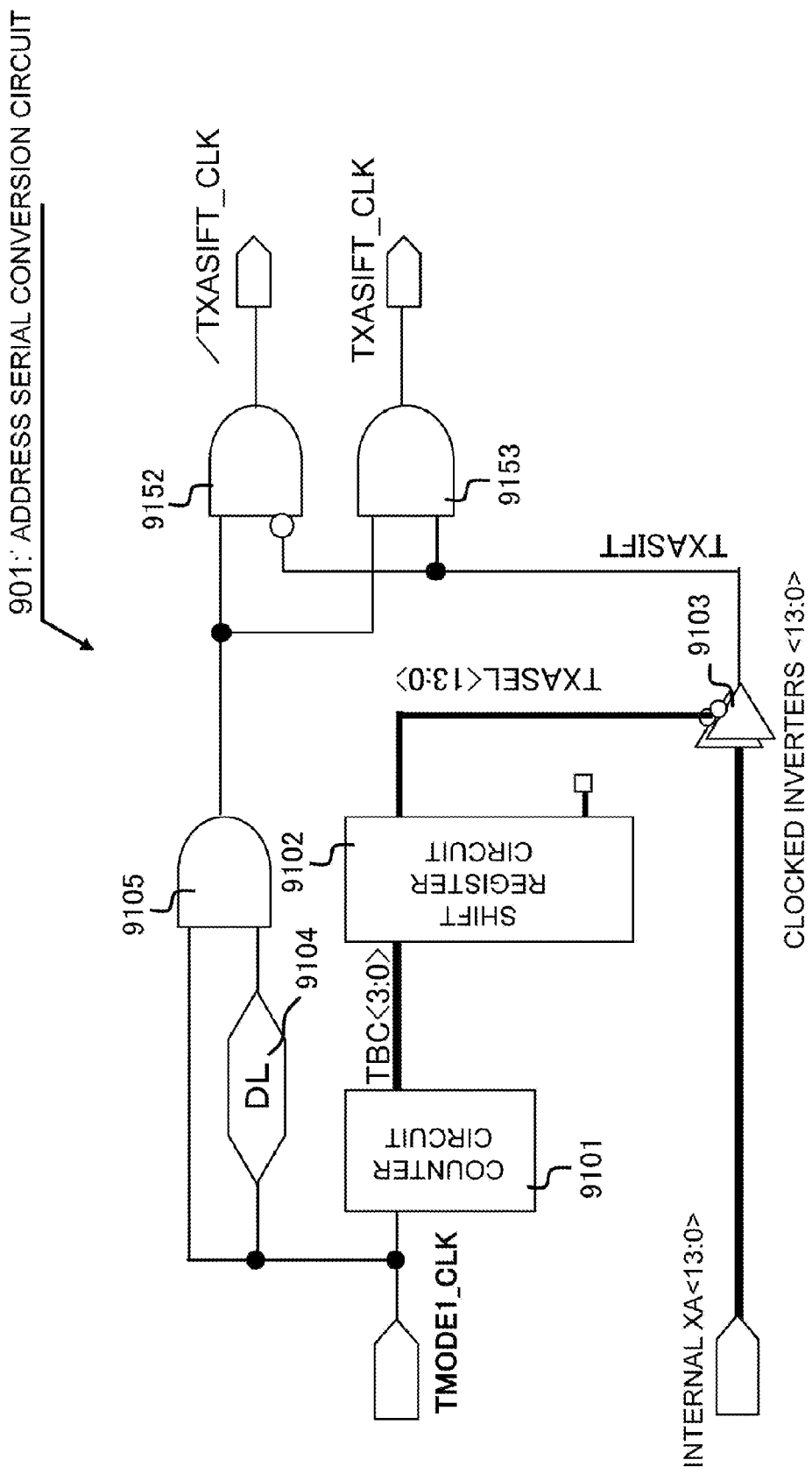
FIG. 19 is a circuit diagram showing an example of a configuration of an address serial conversion circuit 901 according to a sixth embodiment.

FIG. 19 is a circuit diagram showing an example of a configuration of an address serial conversion circuit 901 according to this embodiment. The address serial conversion circuit 901 according to this embodiment may include a counter circuit 9101, a shift register circuit 9102, a clocked inverter circuit 9103, a delay line 9104, and AND circuits 9152, 9153, and 9105. The address serial conversion circuit 901 shown in FIG. 19 is different from the address serial conversion circuit 901 shown in FIG. 4 in that a test mode signal TMODE1 is not supplied to the shift register circuit 9102 in FIG. 19 and that the address serial conversion circuit 901 in FIG. 19 includes the AND circuit 9152 to which a signal /TXASIFT is supplied.

The counter circuit 9101 receives a clock signal TMODE1_CLK and supplies a signal TBC<3:0> of four bits to the shift register circuit 9102.

The signal TBC<3:0> of four bits is supplied to the shift register circuit 9102 from the counter circuit 9101. The shift register circuit 9102 supplies a serially converted signal TXASIFT to the AND circuit 9153 through the clocked inverter circuit 9103. Further, the shift register circuit 9102 supplies the signal /TXASIFT to the AND circuit 9152.

The clock signal TMODE1_CLK and the clock signal TMODE1_CLK that have been delayed through the delay line 9104 are supplied to the AND circuit 9105. Then, the AND circuit 9105 supplies an output signal(s) to the AND circuits 9152 and 9153. As a result, the AND circuit 9153 outputs a serially converted clock signal TXASIFT_CLK. The AND circuit 9152 outputs a signal /TXASIFT_CLK.

It is assumed, for example, that a defective address to be relieved is "#1F34". In that case, the AND circuit 9153 outputs "011111001100100", as the signal TXASIFT_CLK. On the other hand, the AND circuit 9152 outputs "10000011001011", as the signal /TXASIFT_CLK.

Figure 20:
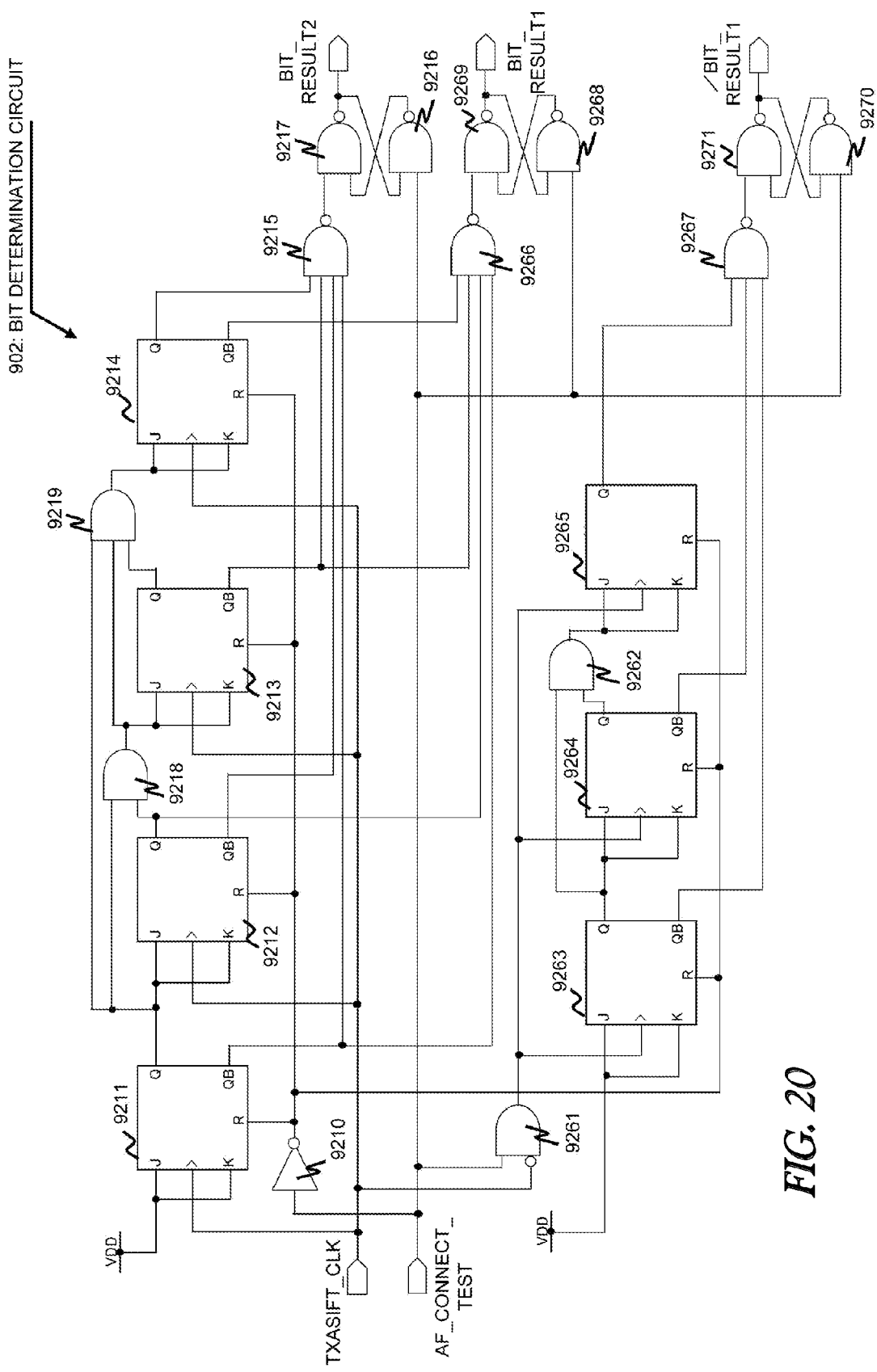
FIG. 20 is a circuit diagram showing an example of a configuration of a bit determination circuit 902 according to the sixth embodiment.

FIG. 20 is a circuit diagram showing an example of a configuration of a bit determination circuit 902 according to this embodiment. The bit determination circuit 902 may include an inverter circuit 9210, JKFF circuits 9211 to 9214 and 9263 to 9265, NAND circuits 9215 to 9217 and 9266 to 9271, and AND circuits 9218, 9219, 9261, and 9262. Since the inverter circuit 9210 and the JKFF circuits 9211 to 9214 are the same as those of the bit determination circuit 902 shown in FIG. 5, detailed description of the inverter circuit 9210 and the JKFF circuits 9211 to 9214 will be omitted.

The serially converted clock signal TXASIFT_CLK and an AF programming test signal AF_CONNECT_TEST are supplied to the AND circuit 9261. Then, the AND circuit 9261 supplies an output signal to a clock terminal(s) of the JKFF circuits 9263 to 9265. Further, an output signal of the inverter circuit 9210, or the signal /AF_CONNECT_TEST is supplied to an input terminal(s) R of the JKFF circuits 9211 to 9214 and 9263 to 9265.

Input terminals J and K of the JKFF circuit 9263 are connected to a power source VDD. Then, the JKFF circuit 9263 supplies an output signal from an output terminal Q thereof to the AND circuit 9262 and input terminals J and K of the JKFF circuit 9264.

The JKFF circuit 9264 supplies an output signal from an output terminal Q thereof to the AND circuit 9262. The JKFF circuit 9264 supplies an output signal from an output terminal QB thereof to the NAND circuit 9267.

The AND circuit 9262 supplies an output signal to input terminals J and K of the JKFF circuit 9265. The JKFF circuit 9265 supplies an output signal from an output terminal Q thereof to the NAND circuit 9267.

An output signal from an output terminal QB of the JKFF circuits 9211 to 9213 and an output signal from an output terminal Q of the JKFF circuit 9214 are supplied to the NAND circuit 9215. Then, the NAND circuit 9215 supplies an output signal to the NAND circuit 9217.

The AF programming test signal AF_CONNECT_TEST and an output signal of the NAND circuit 9217 are supplied to the NAND circuit 9216. Then, the NAND circuit 9216 supplies an output signal to the NAND circuit 9217. That is, the output signal of the NAND circuit 9215 and the output signal of the NAND circuit 9216 are supplied to the NAND circuit 9217. Then, the NAND circuit 9217 outputs an output signal, as a bit determination result signal BIT_RESULT2. Herein, when the number of times of a high level (number of high level bits) in the signal TXASIFT_CLK is 8 or more (8 bits or more), the NAND circuit 9216 outputs the bit determination result signal BIT_RESULT2 of a high level (logic level of "1").

The output signal from the output terminal QB of the JKFF circuits 9211 to 9213 and an output signal from an output terminal QB of the JKFF circuit 9214 are supplied to the NAND circuit 9266. Then, the NAND circuit 9266 supplies an output signal to the NAND circuit 9269.

The AF programming test signal AF_CONNECT_TEST and an output signal of the NAND circuit 9269 are supplied to the NAND circuit 9268. Then, the NAND circuit 9268 supplies an output signal to the NAND circuit 9269. That is, an output signal of the NAND circuit 9270 and the output signal of the NAND circuit 9266 are supplied to the NAND circuit 9269. Then, the NAND circuit 9269 outputs an output signal, as a bit determination result signal BIT_RESULT1. Herein, when the number of times of the high level (number of high level bits) in the signal TXASIFT_CLK is 3 or more (3 bits or more), the NAND circuit 9269 outputs the bit determination result signal BIT_RESULT1 of a high level (logic level of "1").

As described above, the signal from the output terminal Q of the JKFF circuits 9263 and 9265 and the output signal from the output terminal QB of the JKFF circuit 9264 are supplied to the NAND circuit 9267. Then, the NAND circuit 9267 supplies an output signal to the NAND circuit 9271.

The AF programming test signal AF_CONNECT_TEST and an output signal of the NAND circuit 9271 are supplied to the NAND circuit 9270. Then, the NAND circuit 9271 supplies the output signal to the NAND circuit 9270. That is, the output signal of the NAND circuit 9267 and the output signal of the NAND circuit 9271 are supplied to the NAND circuit 9271. Then, the output signal of the NAND circuit 9271 becomes a signal /BIT_RESULT1. Herein, when the number of times of the high level (number of high level bits) is 3 or more (3 bits or more) in the signal /TXASIFT_CLK, the NAND circuit 9271 outputs the output signal /BIT_RESULT1 of a high level (logic level of "1").

In some embodiments, the bit determination circuit 902 outputs the signal /BIT_RESULT1 and the signal BIT_RESULT1, as shown in FIG. 20 in order to accommodate both of the cases where a redundancy circuit is designed for the NOT-side polarity and where the redundancy circuit is designed for the TRUE-side polarity.

Figure 21:
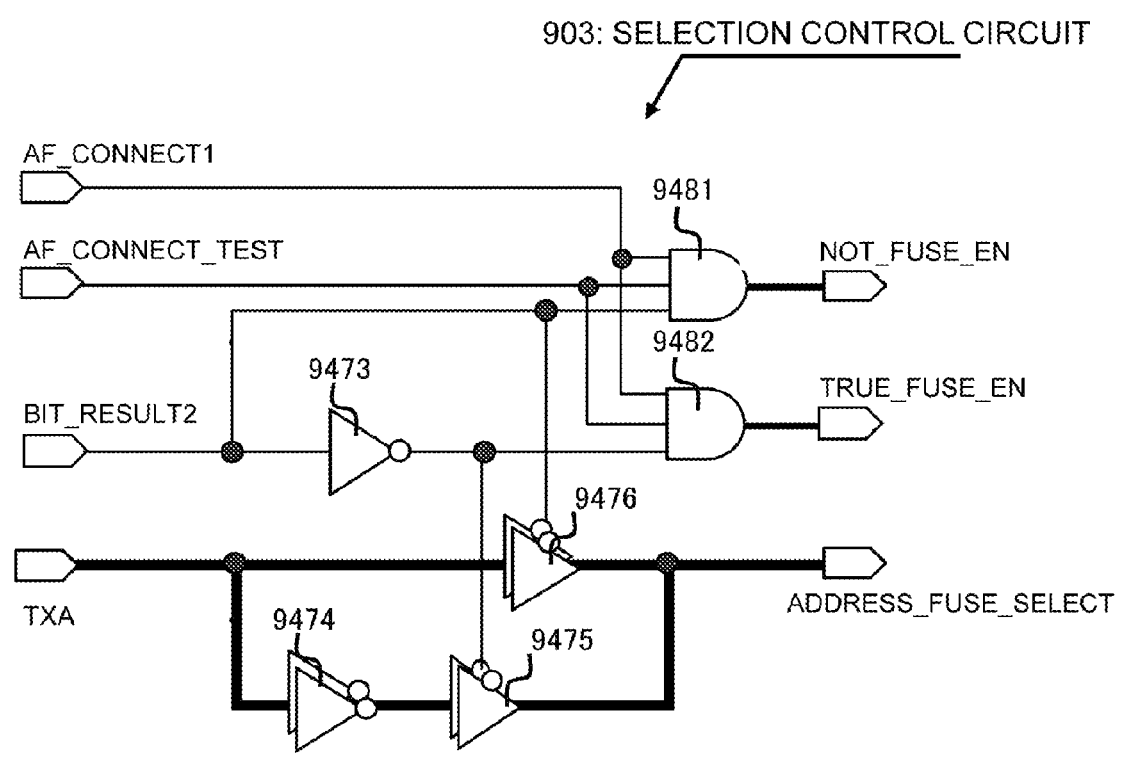
FIG. 21 is a circuit diagram showing an example of a configuration of a selection control circuit 903 according to the sixth embodiment.

FIG. 21 is a circuit diagram showing an example of a configuration of the selection control circuit 903 according to this embodiment. The selection control circuit 903 according to this embodiment may include an inverter circuit 9473, clocked inverter circuits 9474 to 9476, and AND circuits 9481 and 9482. The selection control circuit 903 as shown in FIG. 21 is different from the selection control circuit 903 as shown in FIG. 16 in that a first-time AF programming signal AF_CONNECT1 is supplied to the selection control circuit 903 in FIG. 21. Since the inverter circuit 9473 and the clocked inverter circuits 9474 to 9476 are the same as those of the selection control circuit 903 as shown in FIG. 16, detailed description of the inverter circuit 9473 and the clocked inverter circuits 9474 to 9476 will be omitted.

The first-time AF programming signal AF_CONNECT1, the AF programming test signal AF_CONNECT_TEST, and the bit determination result signal BIT_RESULT2 whose threshold value is 8 bits are supplied to the AND circuit 9481. Then, the AND circuit 9481 outputs an output signal, as a NOT fuse enable signal NOT_FUSE_EN.

The first-time AF programming signal AF_CONNECT1, the AF programming test signal AF_CONNECT_TEST, and a signal /BIT_RESULT2 are supplied to the AND circuit 9482. Then, the AND circuit 9482 outputs an output signal, as a TRUE fuse enable signal TRUE_FUSE_EN.

A case where a defective address to be relieved is "#1F34", for example, is discussed below. In that case, when a third input XA10 has a logic level of "1" (high level) in the serially converted clock signal TXASIFT_CLK, the bit determination result signal BIT_RESULT1 whose threshold value is 3 bits is output at the high level. When an eighth input XA2 in the serially converted clock signal TXASIFT_CLK has a logic level of "1" (high level), the bit determination result signal BIT_RESULT2 whose threshold value is 8 bits is output at the high level. As a result, the selection control circuit 903 determines which one of the TRUE-side polarity and the NOT-side polarity should be used for the redundancy circuit to allow the reduction of the number of the antifuse elements. Then, the selection control circuit 903 selects the antifuse element(s) to be programmed according to the defective address signal.

The threshold value for first-time programming of the antifuse element(s) is set to 3 bits in FIG. 20. However, when the antifuse element(s) is programmed, the number of fuses in a usable state (enabled state) increases by one. Thus, the upper limit of the number of the antifuse elements to be programmed for the first time becomes 4.

FIG. 22 is a table showing a correspondence relationship between the number of divisions of programming and the maximum total number of fuses to be programmed. As shown in FIG. 22, the more the number of divisions of programming increases, the maximum total number of fuses to be programmed is reduced.

FIG. 23 is a table associating each defective address signal with antifuse element polarity selection and the total number of the antifuse elements to be programmed when the number of divisions of programming is two. When the defective address to be relieved is "#1F34", for example, the total number of bits to be switched is 8 bits, as shown in FIG. 23. For that reason, the redundancy circuit is used as a circuit for the NOT-side polarity. Herein, when the number of divisions of programming is two, the antifuse elements for 4 bits are programmed in first-time programming. Then, when the number of divisions of programming is 2, the antifuse elements corresponding to fifth and more bits are programmed in second-time programming. For that reason, in the case of FIG. 23, programming address data to be transferred to the redundancy circuit for the first time are 4 bits (AF-NOT, AF-A13, AF-A7, and AF-A6). Further, programming address data to be transferred to the redundancy circuit for the second time are 3 bits (AF-A3, AF-A1, and AF-A0).

That is, in the semiconductor device 1 according to this embodiment, the number of the antifuse elements needed for a defective address signal is computed and divided. Then, the divided numbers of the antifuse elements are programmed. Consequently, the maximum total number of programming and the number of divisions of programming can be reduced in the semiconductor device 1 according to this embodiment.

Figure 24:
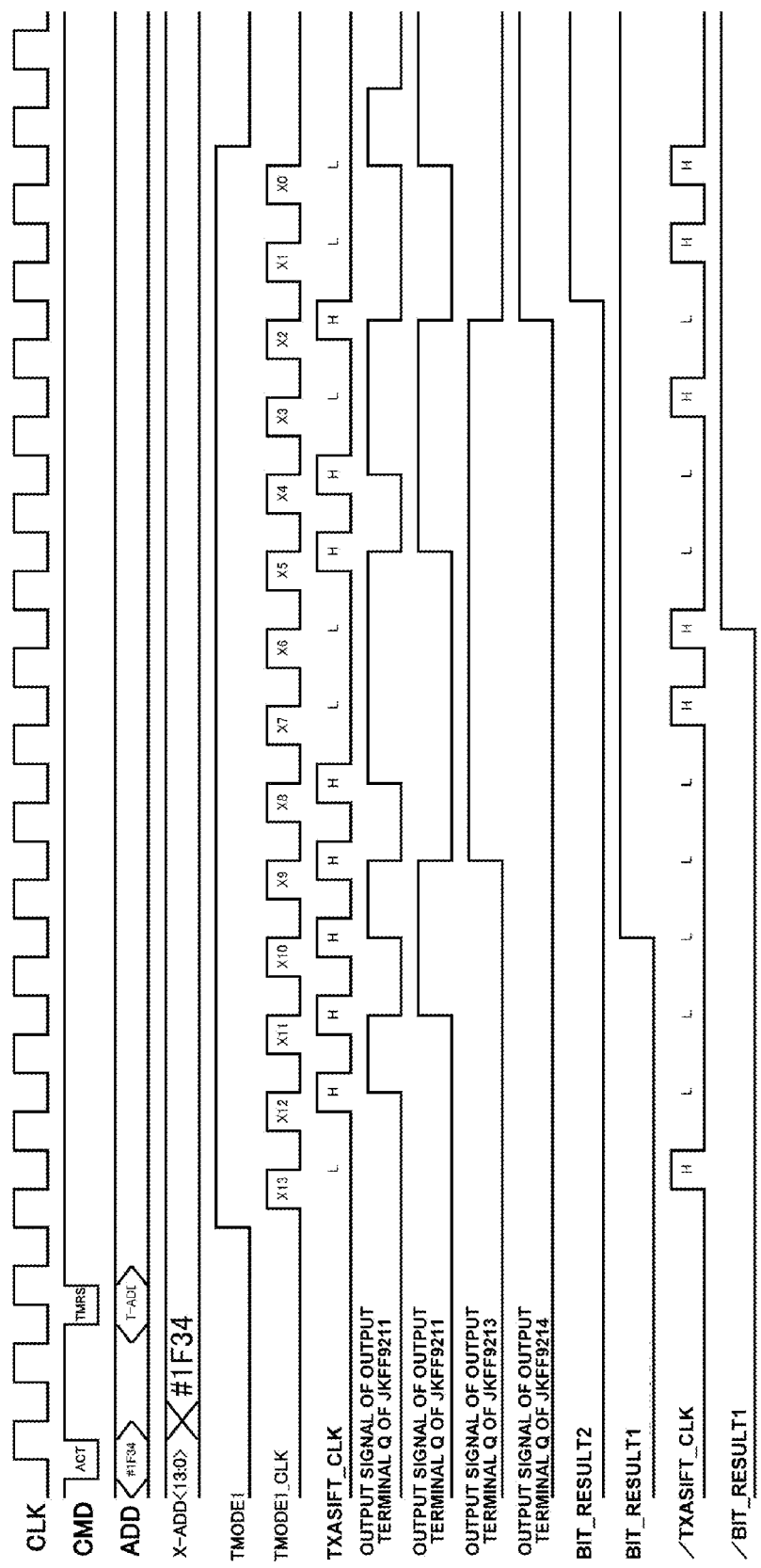
FIG. 24 is a timing diagram when a defective address to be relieved is "#1F34"

FIG. 24 is a timing diagram when the defective address to be relieved is "#1F34". Specifically, FIG. 24 shows that the defective address signal to be relieved is serially converted, and the bit determination result signals BIT_RESULT1, /BIT_RESULT1, and BIT_RESULT2 are output at the high level at a predetermined timing. FIG. 24 is a timing diagram showing the input and output signals of the address serial conversion circuit 901 as shown in FIG. 19, and the input and output signals of the bit determination circuit 902 as shown in FIG. 20.

More specifically, when the serially converted clock signal TXASIFT_CLK as shown in FIG. 24 is supplied three times in a high state, the signal BIT_RESULT1 is output at the high level. When the serially converted clock signal TXASIFT_CLK is supplied three times in a low state, the signal /BIT_RESULT1 is output at the high level. When the serially converted clock signal TXASIFT_CLK as shown in FIG. 24 is supplied eight times in the high state, the signal BIT_RESULT2 is output at the high level.

Figure 25:
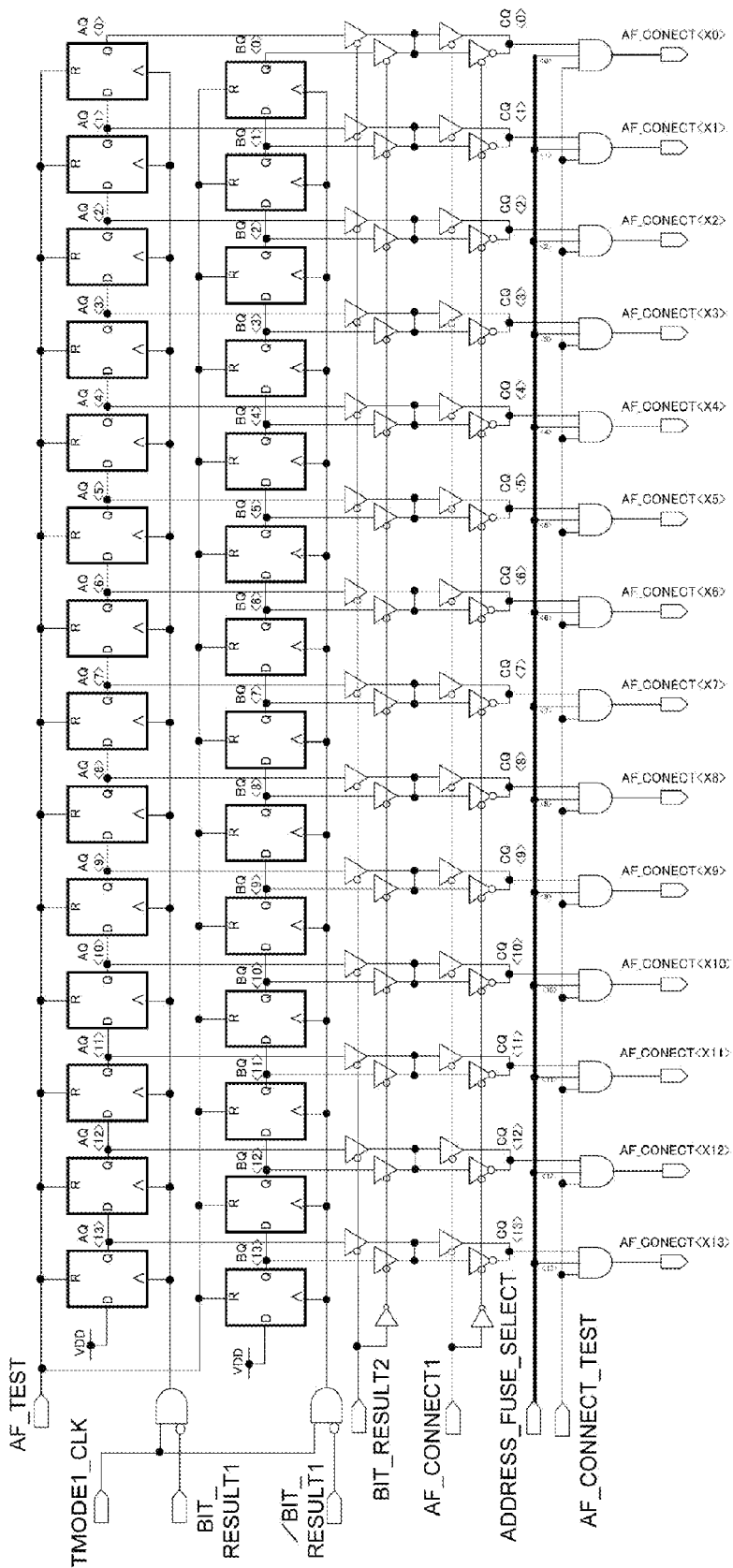
FIG. 25 is a diagram of a circuit in which a clock input is performed until 3 bits are transmitted.

FIG. 25 shows an example of a circuit to which a clock is supplied until the threshold value (of 3 bits) for the first time programming is transmitted. Specifically, in the circuit as shown in FIG. 25, a signal TMODE1_CLK is used as a clock signal for shift circuits. The circuit as shown in FIG. 25 includes a shift circuit for each of the TRUE-side polarity and the NOT-side polarity. Then, the circuit as shown in FIG. 25 is a circuit that can associate the shift circuit and the bit determination result signal BIT_RESULT2 whose threshold value is 8 bits. It is assumed herein that each of the signals BIT_RESULT1, /BIT_RESULT1, and BIT_RESULT2 is supplied to the circuit shown in FIG. 25. In that case, the upper limit of the number of the antifuse elements including an enable fuse to be programmed for the first time is 4 bits. Then, the antifuse elements for fifth and more bits are the antifuse elements to be programmed, for the second time. The enable fuse holds data indicating whether or not the antifuse element(s) is programmed.

Figure 26:
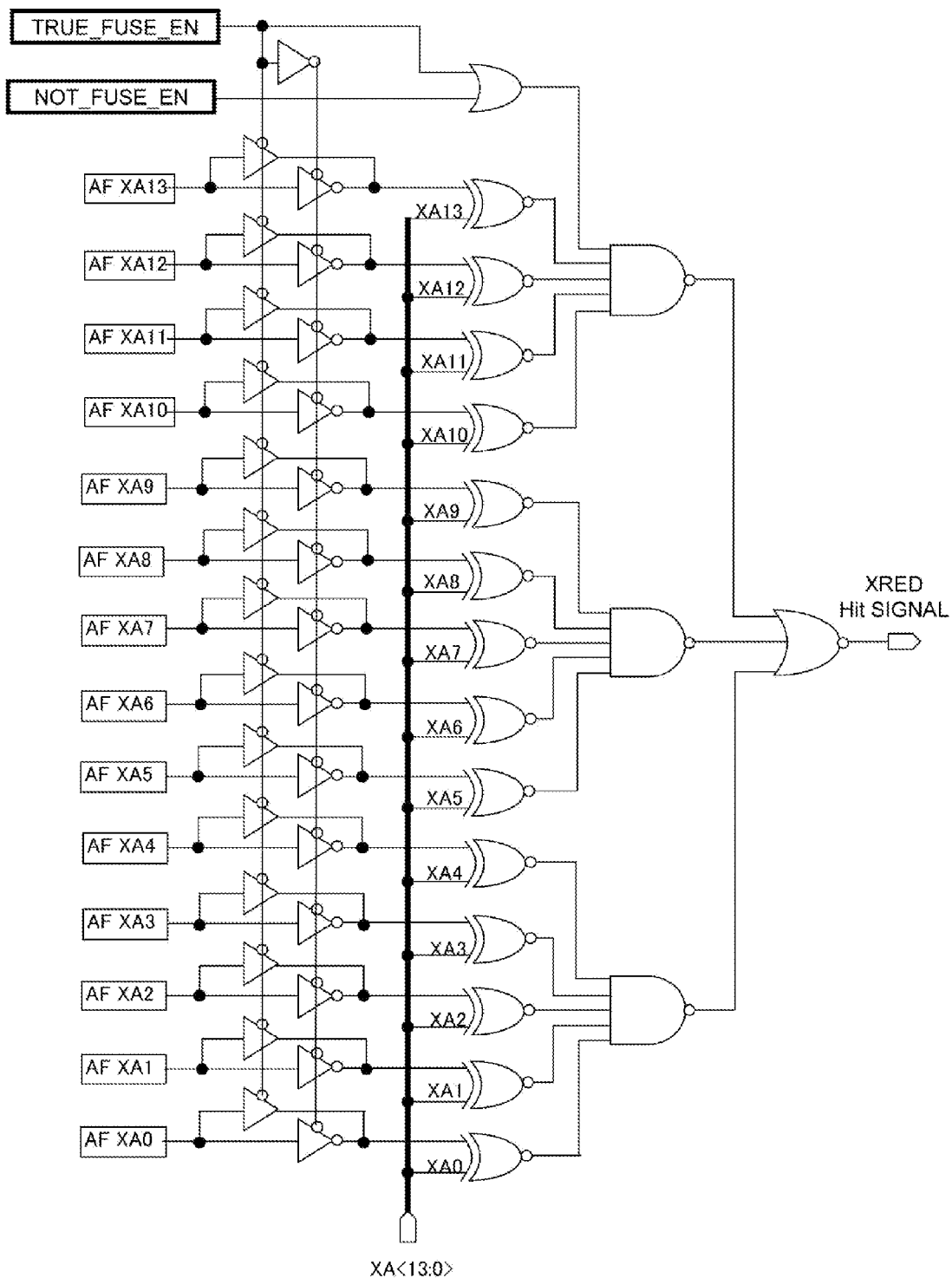
FIG. 26 is a circuit diagram showing an example of a configuration of a fuse set.

FIG. 26 is a circuit diagram showing an example of a configuration of each fuse set. The TRUE fuse enable signal TRUE_FUSE_EN, the NOT fuse enable signal NOT_FUSE_EN, and defective address signals AF_XA13 to AF_XA0 are supplied to the fuse sets as shown in FIG. 26. When the TRUE fuse enable signal TRUE_FUSE_EN at a high level is supplied to each fuse set as shown in FIG. 26, the antifuse element(s) becomes at a high state. On the other hand, when the NOT fuse enable signal at a high level is supplied, the antifuse element(s) becomes at a low state.

As described above, a defective address to be relieved is time-divided and is then programmed in the semiconductor device 1 according to this embodiment. On that occasion, the semiconductor device 1 according to this embodiment uses the redundancy circuit by which the antifuse element(s) can be selected so that the number of addresses to be programmed is reduced. Consequently, when the defective address to be relieved is time-divided and is then programmed in the semiconductor device 1 according to this embodiment, the upper limit of the number of the antifuse elements to be programmed at a time can be reduced. Accordingly, the semiconductor device 1 according to this embodiment can more efficiently relieve a defective memory cell.

In the semiconductor device 1 according to this embodiment, the upper limit of the number of the antifuse elements to be programmed can be reduced, without changing a timing of programming the antifuse element(s). Thus, even if a timing of programming the antifuse element(s) is proposed by a different company, the above-mentioned effect can be achieved in the semiconductor device 1 according to this embodiment. Consequently, the semiconductor device 1 according to this embodiment contributes to improvement in the success rate of programming the antifuse element(s) and a reduction of the programming period.

In the above-mentioned embodiment(s), the description was given using an antifuse element(s) as an example of a program element(s). This does not mean, however, that the subject of the present application is limited to the antifuse element(s). The program element(s) may be a metal fuse, a polysilicon fuse, or the like, for example.

In the above-mentioned embodiment(s), the description was given using the DRAM as an example of the semiconductor device. This does not mean, however, that the subject of the present application is limited to the DRAM. The present application can also be applied to a different semiconductor device such as an SRAM (Static Random Access Memory), a ROM (Read Only Memory), or the like if the different semiconductor device has a configuration in which a defective memory cell can be relieved by using a program element.

In the embodiment, the description was given, using a case where a defective address was formed of 16 bits, and the determination threshold values were set to 8 bits and 3 bits. This does not mean, however, that the subject of the present application is limited to these numbers of the bits. By changing the circuit configuration, the present application can be of course applied even if a different determination threshold value is used.

CONCLUSION

According to a first aspect of the present application, there is provided semiconductor device including:

an address serial conversion circuit configured to serially convert a defective address signal and to output the converted signal as a serially converted address signal;

a bit determination circuit configured to receive the serially converted address signal, to count the number of times of a high level in the received serially converted address signal as the number of times of the high level, and to output whether or not the number of times of the high level exceeds a predetermined determination threshold, as a bit determination result signal; and a selection control circuit configured to select a program element(s) to be cut off, based on the bit determination result signal.

According to a second aspect of the present application, there is provided a control method of a semiconductor device, the control method comprising:

converting serially a defective address signal and outputting the converted signal as a serially converted address signal;

determining a bit of receiving the serially converted address signal, counting the number of times of a high level in the received serially converted address signal as the number of times of the high level, and outputting whether or not the number of times of the high level exceeds a predetermined determination threshold, as a bit determination result signal; and controlling a selection selecting a program element(s) to be cut off, based on the bit determination result signal.

According to a third aspect of the present application, there is provided a relieving method, comprising:

writing data into a semiconductor memory device;

reading the written data, comparing the read data with an expected value, and determining an address with the data written thereinto as a defective address when the read data and the expected value do not match each other;

determining a bit counting a number of bits at a first logic level in the defective address, the defective address being formed of a plurality of bits at one or both of the first logic level and a second logic level different from the first logic level, and outputting whether or not a value of the count exceeds a determination threshold value, as a bit determination result signal; and controlling a selection selecting supplying an address obtained by inverting the first and second logic levels of the respective bits of the defective address to a program element(s) comprising an antifuse element(s), or supplying the defective address without the inversion to a program element(s), based on the bit determination result signal.

Other aspects of various embodiments are also described herein. Thus, modification and adjustment of each embodiment and each example are possible within the scope of the overall disclosure (including the claims) of the present application and based on the basic technical concept of the present application. Various combinations and selections of various disclosed elements (including each element in each claim, each element in each embodiment and each example, each element in each drawing, and the like) are possible within the scope of the claims of the present application. That is, the present application naturally includes various variations and modifications that could be made by those skilled in the art according to the overall disclosure including the claims and the technical concept. With respect to a numerical value range described herein in particular, an arbitrary numerical value and a small range included in the numerical value range should be construed to be specifically described even unless otherwise explicitly described.

What is claimed is:

1. A semiconductor device, comprising:
a bit determination circuit to count a number of bits at a first level in an input address signal formed of a plurality of bits, and to output a result of counting indicating whether or not a value of the count exceeds a predetermined determination threshold value, as a bit determination result signal; and
a selection control circuit to select a non-volatile program element to be cut off, based on the bit determination result signal and the address signal,
wherein the semiconductor device comprises:
an internal power source to output a voltage for cutting off program element; and
a power supply control circuit to control the internal power source, wherein the power supply control circuit to control the voltage of the internal power source according to the bit determination result signal.

2. The semiconductor device according to claim 1, wherein the program element comprises an antifuse element.

3. The semiconductor device according to claim 1, further comprising:
an address serial conversion circuit to convert signals supplied as parallel data and indicating a defective address to a serial signal, and to output the serial signal as the address signal.

4. The semiconductor device according to claim 1, wherein when the value of the count is equal to or higher than the predetermined determination threshold value, the selection control circuit cuts off the program element based on the address signal indicating a level other than the first level, and when the value of the count is less than the predetermined determination threshold value, the selection control circuit cuts off the program element based on the address signal indicating the first level.

5. The semiconductor device according to claim 1, wherein the program element comprises a program element of a TRUE-side polarity and a program element of a NOT-side polarity; and
when the value of the count is equal to or higher than the predetermined determination threshold value, the selection control circuit is to invert the first level of each bit of the address signal to a second level different from the first level and to invert the second level of each bit of the address signal to the first level, and to supply a signal obtained by the inversion to the program element of the NOT-side polarity, and when the value of the count is less than the predetermined determination threshold value, the selection control circuit does not invert the address signal, and is to supply the address signal to the program element of the TRUE-side polarity.

6. A semiconductor device, comprising:
a bit determination circuit to count a number of bits at a first level in an input address signal formed of a plurality of bits, and to output a result of counting indicating whether or not a value of the count exceeds a predetermined determination threshold value, as a bit determination result signal; and
a selection control circuit to select a non-volatile program element to be cut off, based on the bit determination result signal and the address signal, wherein
the selection control circuit is to determine a priority order of the program element to be cut off, based on whether the value of the count is equal to or higher than the predetermined determination threshold value.

7. A semiconductor device, comprising:
a bit determination circuit to count a number of bits at a first level in an input address signal formed of a plurality of bits, and to output a result of counting indicating whether or not a value of the count exceeds a predetermined determination threshold value, as a bit determination result signal; and
a selection control circuit to select a non-volatile program element to be cut off, based on the bit determination result signal and the address signal, wherein
the selection control circuit is to change the program element to be cut off and data on a defective address to be stored in the program element, according to whether or not the value of the count is equal to or higher than the predetermined determination threshold value.

8. The semiconductor device according to claim 1, wherein when the value of the count is equal to or higher than the predetermined determination threshold value, the selection control circuit is to invert each bit of the address signal, and to select the program element based on a serially converted address signal obtained by the inversion.

9. The semiconductor device according to claim 1, wherein the selection control circuit is to cut off the program element in time division, and according to a total number of the program element, to change a number of the program element to be cut off at each cut-off timing for the program element.

10. A method of relieving a semiconductor device, comprising:
writing data into a semiconductor memory device;
reading the mitten data, comparing the read data with an expected value, and determining an address with the data written thereinto as a defective address when the read data and the expected value do not match each other;

determining a bit by counting a number of bits at a first logic level in the defective address, the defective address being formed of a plurality of bits at one or both of the first logic level and a second logic level different from the first logic level, and outputting whether or not a value of the count exceeds a determination threshold value, as a bit determination result signal; and controlling a selection to supply an address obtained by inverting the first and second logic levels of the respective bits of the defective address to a program element comprising an antifuse element based on the bit determination result signal.

11. The method of relieving the semiconductor device according to claim 10, further comprising:

programming simultaneously the program element corresponding to the bits at the first level in the defective address supplied to the program element with the inversion, during the controlling the selection.

12. The method of relieving the semiconductor device according to claim 10, wherein during the controlling the selection, a priority order of the program element to be cut off is determined, based on whether or not the value of the count exceeds the determination threshold value.

13. The method of relieving the semiconductor device according to claim 10, wherein controlling the selection further changes a programming voltage to be supplied to the program element, based on whether or not the number of the count exceeds the determination threshold value.

14. The method of relieving the semiconductor device according to claim 10, wherein during the controlling the selection, the defective address is supplied to the program element in time division, and the program element is programmed according to a number of the bits in the time-divided defective address.

15. The method of relieving the semiconductor device according to claim 10, wherein the controlling the selection is to supply the defective address without the inversion to the program element.

16. The method of relieving the semiconductor device according to claim 10, further comprising:

programming simultaneously the program element corresponding to the bits at the first level in the defective address supplied to the program element without the inversion, during the controlling the selection.

* * * * *